(12) United States Patent
Madurawe

(10) Patent No.: US 6,828,689 B2
(45) Date of Patent: Dec. 7, 2004

(54) SEMICONDUCTOR LATCHES AND SRAM DEVICES

(75) Inventor: Raminda U. Madurawe, Sunnyvale, CA (US)

(73) Assignee: VI CI CIV, Sunnyvale, CA (US)

( * ) Notice: Subject to any disclaimer, the term of this patent is extended or adjusted under 35 U.S.C. 154(b) by 71 days.

(21) Appl. No.: 10/413,810

(22) Filed: Apr. 14, 2003

(65) Prior Publication Data

US 2004/0004298 A1 Jan. 8, 2004

Related U.S. Application Data

(60) Provisional application No. 60/393,763, filed on Jul. 8, 2002, provisional application No. 60/397,070, filed on Jul. 22, 2002, provisional application No. 60/400,007, filed on Aug. 1, 2002, provisional application No. 60/402,573, filed on Aug. 12, 2002, and provisional application No. 60/449,011, filed on Feb. 24, 2003.

(51) Int. Cl.[7] .............................................. H01L 27/11
(52) U.S. Cl. ................................ 257/903; 257/E27.098
(58) Field of Search .......................... 257/903, E27.098

(56) References Cited

U.S. PATENT DOCUMENTS

| | | |
|---|---|---|
| 4,065,781 A | 12/1977 | Gutknecht |
| 4,502,204 A | 3/1985 | Togashi et al. |
| 4,872,141 A * | 10/1989 | Plus et al. .................. 365/154 |
| 5,214,295 A | 5/1993 | Manning |
| 5,537,078 A | 7/1996 | Strong |
| 5,625,221 A | 4/1997 | Kim et al. |
| 5,674,770 A | 10/1997 | Lee et al. |
| 5,943,574 A | 8/1999 | Tehrani et al. |
| 6,107,642 A | 8/2000 | Sundaresan |
| 6,222,234 B1 | 4/2001 | Imai |
| 6,271,063 B1 | 8/2001 | Chan et al. |
| 6,339,244 B1 | 1/2002 | Krivokapic |
| 6,383,848 B1 | 5/2002 | Violette |
| 6,406,951 B1 | 6/2002 | Yu |
| 6,451,656 B1 | 9/2002 | Yu et al. |
| 6,504,742 B1 | 1/2003 | Tran et al. |
| 6,545,319 B2 | 4/2003 | Deane et al. |
| 6,579,750 B1 | 6/2003 | Krivokapic |
| 2001/0043486 A1 | 11/2001 | Nattzinger et al. |
| 2001/0053089 A1 | 12/2001 | Noble |
| 2002/0079496 A1 | 6/2002 | Deane et al. |
| 2002/0168804 A1 | 11/2002 | Van der Zaag et al. |
| 2003/0062574 A1 | 4/2003 | Heieh |

* cited by examiner

*Primary Examiner*—David Nelms
*Assistant Examiner*—Tu-Tu Ho
(74) *Attorney, Agent, or Firm*—Tran & Associates

(57) ABSTRACT

A new Static Random Access Memory (SRAM) cell using Thin Film Transistors (TFT) is disclosed. In a first embodiment, an SRAM cell comprises a strong inverter and a strong access device constructed on a semiconductor substrate layer, and a weak inverter and a weak access device constructed in a semiconductor thin film layer located vertically above the strong devices. The strong devices are used in the data read and write paths, and the weak devices are used for latch feed-back and sector data erase. This first embodiment is used for high density and high speed memory applications. In a second embodiment, an SRAM cell comprises thin film inverters and thin film access devices constructed in a semiconductor thin film layer located substantially above logic transistors. The TFT SRAM cell is buried above the logic gates of an Integrated Circuit to consume no extra Silicon real estate. This second embodiment is used for slow access and Look-Up-Tables type memory applications.

15 Claims, 16 Drawing Sheets

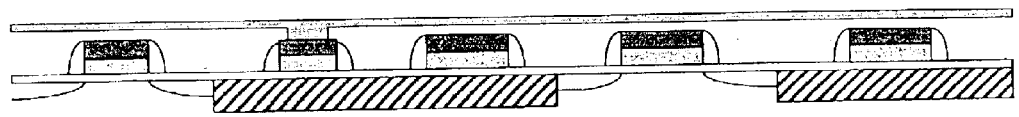
Fig - 14.1
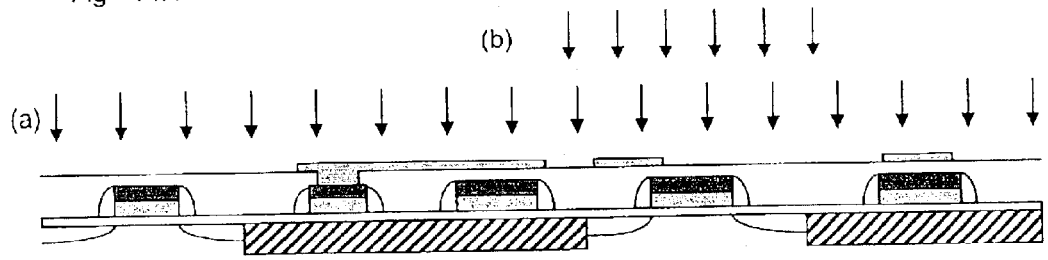
Fig - 14.2
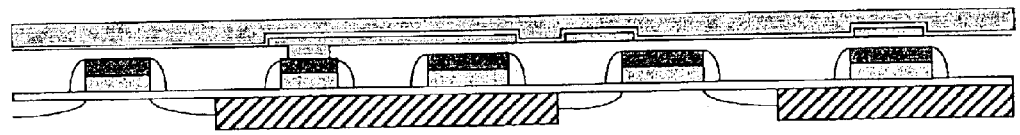
Fig - 14.3
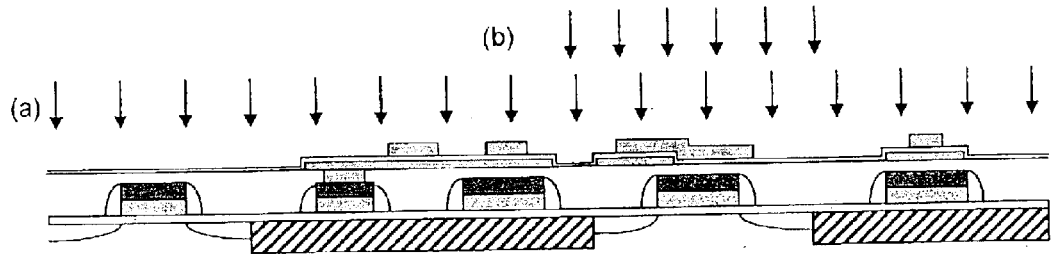
Fig - 14.4

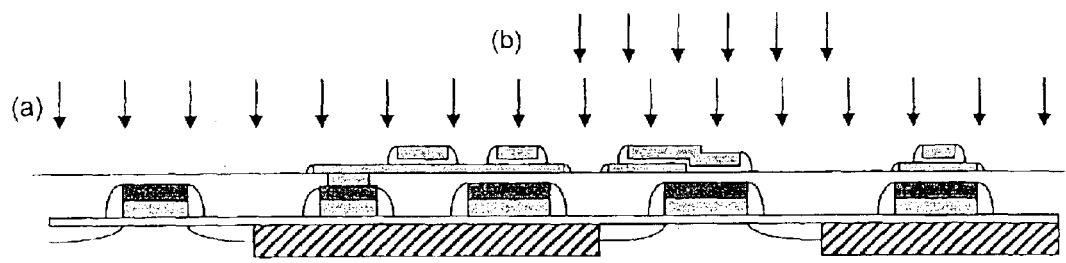
Fig - 14.5
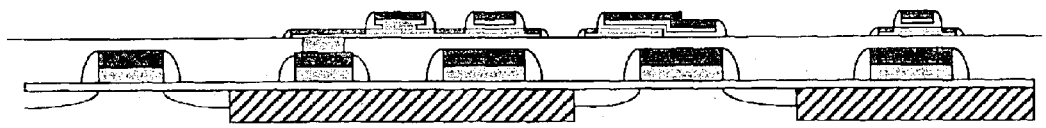
Fig - 14.6
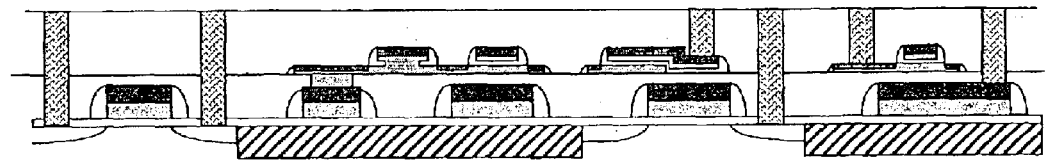
Fig - 14.7

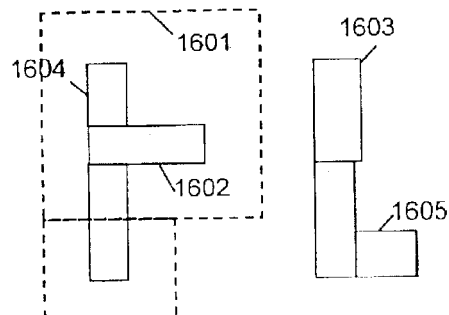
Fig - 16.1
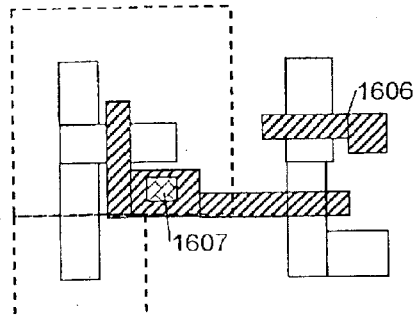
Fig - 16.2
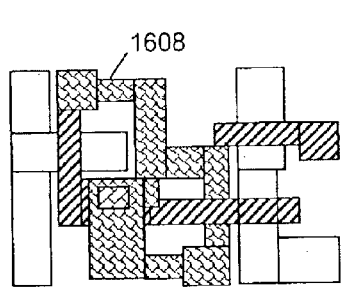
Fig - 16.3
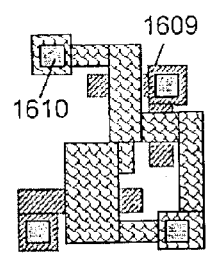
Fig - 16.4
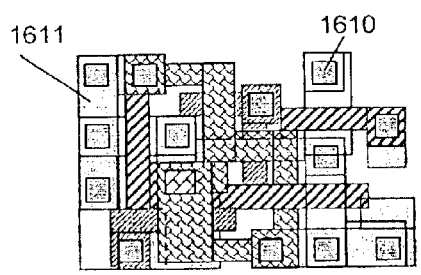
Fig - 16.5
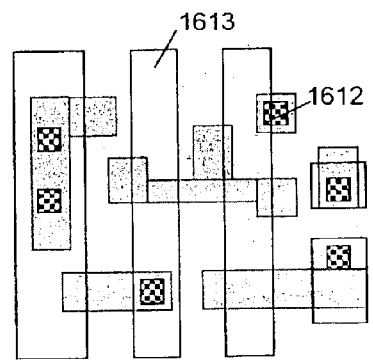
Fig - 16.6
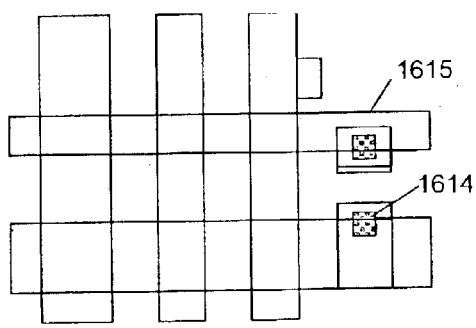
Fig - 16.7

SEMICONDUCTOR LATCHES AND SRAM DEVICES

This application claims priority from Provisional Application Ser. No. 60/393,763 entitled "Wire Replaceable TFT SRAM Cell and, Cell Array Technology", filed on Jul. 08, 2002, Provisional Application Ser. No. 60/397,070 entitled "Wire Replaceable Thin Film Fuse and Anti-fuse Technology", filed on Jul. 22, 2002, Provisional Application Ser. No. 60/400,007 entitled "Re-programmable ASIC", filed on Aug. 01, 2002 and Provisional Application Ser. No. 60/449,011 entitled "SRAM cell and cell arrays", filed on Feb. 24, 2003, all of which list as inventor Mr. R. U. Madurawe and the contents of which are incorporated-by-reference. This application also claims the priority from Provisional Application Ser. No. 60/403,573 filed on Aug. 12, 2002.

This application is also related to application Ser. No. 10/267,484 entitled "Methods for Fabricating Three-Dimensional Integrated Circuits", application Ser. No. 10/267,483 entitled "Three Dimensional Integrated Circuits", and application Ser. No. 10/267,511 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference.

A new IGFET device is disclosed in the application Ser. No. 10/413,808 entitled "Insulated-Gate Field-Effect Thin Film Transistors". A new switching device is disclosed in the application Ser. No. 10/413,809 entitled "Semiconductor Switching Devices". Both are filed concurrently herewith and list as inventor Mr. R. U. Madurawe, the contents of which are incorporated-by-reference.

BACKGROUND

The present invention relates to semiconductor latches and Static Random Access Memory (SRAM) devices.

A latch is a data storage unit in a semiconductor device comprising of two inverters. An inverter has an input and an output having a voltage of opposite polarity to said input. The inverter is connected between a system power voltage level and system ground voltage level. Two such inverters connected back-to-back have self sustaining voltages at their inputs and outputs. A static random access memory (SRAM) device is a type of semiconductor memory device that has low power consumption and fast access time relative to a dynamic random access memory (DRAM) device. An SRAM cell comprises a latch and one or more access devices. The latch stores binary data, and the access device provides the capability to read and write data into the latch. Multiple access devices provide multiple access paths to read and write the single latch data. An SRAM memory device is essentially an array of SRAM cells. They are classified by the type of inverter in the latch, by the total transistor count in the SRAM cell and by the number of access devices to configure the latch. Typical latches do not have mixed inverters as the latch transistors depend on the fabrication process technology. There are two common types of inverters used for SRAM latches: a high load resistor cell employing a high resistor or a depletion load resistor as a pull-up device of the inverter, and a CMOS type cell employing a PMOS transistor as a pull-up device of the inverter. The CMOS type cell can be further sub-divided into a thin-film transistor (TFT) cell employing a thin-film PMOS transistor (TFPT) as the pull-up device, and a full CMOS cell employing a bulk PMOS transistor as the pull-up device. In all cases the pull-down device of the inverter is a bulk NMOS transistor in SRAM construction.

SRAM classified by the total transistor count include 5T (five transistor) SRAM cells, 6T (six transistors) SRAM cells, 2T/2R (two transistor, two resistor) SRAM cells, among many others. Some labels are misnomers as the full transistor count excludes capacitors and resistors needed to make the SRAM cell function correctly. In all cases, each cell includes a bi-stable latch, with two self consisting stable output values: logic 0 (voltage $V_S$) and logic 1 (voltage $V_D$). The output of the SRAM latch can be set to zero or one through the access transistors. The number of access transistors connected to an SRAM latch defines single port, dual port and multi port memory functionality. Multi-port feature is useful to read and write data in latches at different locations simultaneously.

An SRAM cell in single crystal Silicon (Si) has three different methods of fabrication. The most popular 6T SRAM cell, FIG. 1, has six MOSFET transistors. Fabrication is kept simple with no special processing needed by using standard CMOS transistors for the SRAM cell. All six transistors are located in substrate Silicon, and all have high mobility for electron and hole conduction. They are strong devices. The cell area is large, standby current is negligible and the access time is very fast. This configuration is used for high cost, least power, fastest access SRAM memory. In 5T SRAM memory, transistor 111 is not used.

In FIG. 1A, the SRAM cell contains a latch comprised of two switching devices (inverters) 104 and 107 back to back and two access transistors 110 and 111 that allow the data terminal 101 and/data (not data) terminal 102 to write and store 0 or 1 in the latch. The two stable operating points of the latch are alterable through the two access transistors 110, 111 via a common gate terminal 103. A single inverter 104 cannot hold data indefinitely as an isolated gate node would lose charge from junction leakages. A feedback inverter provides a current drive to the first inverter gate node to replenish lost charge. Each inverter charges the other. The use of CMOS inverters allow both logic "0" state and logic "1" state at the input of the inverter 104 and its opposite state at the input of the inverter 107 indefinitely while power is on. Internally, the inverters 104, 107 use NMOS transistors 106, 109 and PMOS transistors 105, 108 as shown in the latch in FIG. 1B. Latch transistor dimensions are scaled to ensure proper writing of these two states into the latch, cell stability against alpha particles and noise.

For a number of reasons, among them controllability and consistent current drive being the foremost, the high speed, low power SRAM memory latch is conventionally fabricated on single crystal Silicon using standard CMOS transistors for the SRAM cell. The resulting transistor consumes a relatively large amount of Silicon area. FIGS. 2A and 2B show top view and cross sectional view of a conventional CMOS inverter fabricated using a logic twin well process. An NMOS transistor 205 is inside a P-well 208, while a PMOS transistor 206 is inside an N-well 207 shown in dotted line. PMOS source 211 and drain 212 diffusions are P+ diffusion regions, while NMOS source 214 and drain 213 diffusions are N+ diffusion regions. Due to potential latch-up conditions, a separation distance Y in FIG. 2 is maintained between the two transistors 205 and 206. Both Nwell 207 and Pwell 208 are constructed on a substrate 200 of the device, which could be P-type or N-type. Latch-up arises from the P+/N-well/P-Well regions 212/207/208 and N+/P-Well/N-well regions 213/208/207 bipolar parasitic transistors near the well boundary as shown in FIG. 2B. Due to this separation, the Silicon conducting path for current flow can not be constructed in a single active semiconductor geometry. In FIG. 2B, PMOS source 211 and body 207 are tied to $V_D$ 203, and NMOS source 214 and body 208 are tied to $V_S$ 204. In other applications, the body may be separately biased. The Pwell 208 has to be biased to the lowest potential, while the Nwell 207 has to be biased to the highest potential.

In addition to the single crystal Silicon approach, an SRAM latch can be fabricated as a Resistor-load latch and a TFT PMOS-load latch, both of which have the pull-up device vertically integrated, requiring special polycrystalline (poly) Silicon for the load device. The resistor-load latch, FIG. 3A, has poly Silicon resistors 305 & 308 as pull up devices, instead of PMOS devices. The vertically integrated single poly Silicon film allows elimination of N-wells in the substrate, and a smaller cell area construction. Only four NMOS transistors 110, 111 in FIG. 1 and 306, 309 in FIG. 3A are built on substrate Silicon, a reduction from six in full CMOS. These cells consume standby power as one inverter is always conducting, and the power consumption is determined by the resistor value. For 1 Meg density of latches and 1 mA standby current, a resistor value of 1 GOhms is needed. High value intrinsic poly-Silicon resistors are hard to build, and TFT PMOS devices offer better manufacturability. As shown in FIG. 3B, TFT PMOS can be also used as active weak PMOS pull-up devices similar to regular PMOS in FIG. 1 to eliminate stand-by current. As the pull-up device 305 or 315 current drive is very weak, these inverters cannot drive a strong logic one. These configurations of inverters are only used to build latches to construct low cost, high density, higher power, and slower access time SRAM memory. Such memories need complex dual ended sense amplifiers to read the latch data, and are sensitive to noise. As a result, embedded memory and multi-port memory is mostly constructed with CMOS latches.

In all cases the four NMOS transistors 110, 111 and the two more in inverters 104 and 107 in FIG. 1A (106, 109 in FIG. 1B or 306, 309 in FIG. 3A or 316, 319 in FIG. 3B) are strong. Metal Oxide Semiconductor Field Effect Transistors (MOSFET) fabricated on single crystal Silicon. This is due to the popularity of MOSFET devices over JFET, and the ability to form complementary MOSFET (known as CMOS) gates. MOSFET and JFET transistors are discussed next.

The MOSFET operates by conducting current between its drain and source through a conducting surface channel created by the presence of a gate voltage. FIG. 4 shows a cross section of an N-MOSFET (NMOS) conducting channel 410 with a depletion region shown shaded. In FIG. 4, an NMOS transistor body 400 is P− doped, isolating an N+ doped source region 414 and an N+ doped drain region 413. Source and drain diffusions are connected to terminals 404 and 403 respectively. The result is the formation of two N+/P− back-to-back reverse-biased diodes. For this discussion, the source 404 is assumed at zero ($V_S$). When the voltage 402 at gate 412 is zero, the N+/P− back-to-back reverse-biased diodes do not conduct and the transistor is off. There is no surface channel 410, and the body surface under insulator 405 next to gate 412 is in accumulation of majority hole carriers. The conduction path between source and drain is now substantially non-conductive. In the embodiment of FIG. 4, the gate 412 includes a salicided region 422. A spacer 420 is formed adjacent to gate 412. Source and drain salicidation is not shown in FIG. 4. When the gate voltage 402 is greater than a threshold voltage ($V_T$) of the transistor, an inversion occurs near the surface, shown by channel 410, completing an electron carrier path between the source 414 and drain 413 regions causing current flow. The conducting path now include source 414, channel 410 and drain 413 and is substantially conductive. In addition to the inversion layer, charge depletion occurs adjacent to the body region 400 due to the gate, source and drain voltages. The component of this depleted charge from the gate voltage determines the magnitude of the $V_T$. Trapped oxide charge and Silicon defects affect the $V_T$ transistor parameter. The more positive the voltage is at the gate, the stronger is the conduction. At all levels, the substrate 400 potential is kept at the lowest voltage level. In most applications, the substrate and source are held at $V_S$. Substrate can be pumped to negative voltages for special applications.

A PMOS device is analogous to an NMOS device, with the device operational polarity and doping types reversed. PMOS source is typically tied to $V_D$. A PMOS is on when the gate is at $V_S$, and off when the gate is at $V_D$. Conducting path includes a P+ doped source and drain, and a surface inversion layer in the Nwell body region. The Nwell is biased to the highest potential, and in most applications the source and Nwell are held at $V_D$. The PMOS and NMOS in a CMOS inverter share a common gate with identical voltage range. When the CMOS inverter input (or gate) is at $V_D$, the inverter output is at $V_S$, and visa-versa.

As discussed in U.S. Pat. No. 5,537,078, conventional JFET transistors are of two main types: P-channel (PJFET) and N-channel (NJFET). The NJFET in FIG. 5 has a semiconductor channel 506 doped N− and positioned between two N+ diffusions 513 and 514. Conducting path includes diffusion 513, resistive channel 506 and diffusion 514. Terminals 503 and 504 are coupled to diffusions 513 and 514. The terminal supplying the majority carrier to the channel (which is the lowest potential) is designated the source (S) while the other terminal is designated the drain (D). Across the N− channel 506 there are two diffused gates which are referred to as the top gate 512 and the bottom gate 522. Those are connected to terminals 502 and 532 respectively. Each gate is doped with P+ type dopant to create two back to back P+/N−αdiodes. When drain and source voltages are different, the drain to source current passes entirely through the conducting N− channel 506. This current increases with higher voltage drop between the terminals, reaching a saturation value at high biases. The gates are biased to keep the gate to channel P+/N− junctions reversed biased. The reversed biased voltage creates depletion regions 510 and 520 that penetrate into the channel reducing the channel height available for current flow. The depletion regions merge at drain end 530 to cause current saturation at high drain bias. The gate voltages also control the flow of current between the source and drain by modulating the channel height. When the gate reverse bias is sufficiently large, the entire channel is pinched-off causing no current flow between drain and source. Conducting path is then substantially non-conductive. In both on and off states of a JFET, there is no current flow through the gate terminal due to reverse bias junction voltages, except for junction leakage current. For the device in FIG. 5 a negative gate voltage (lower than $V_S$) creates the channel off condition. Such a negative gate voltage increases the operating voltage of this process, a draw back for JFET scheme.

A PJFET device is analogous to an NJFET device, with the device operational polarity and doping types reversed. PJFET source is held at $V_D$. A PJFET is on when the gate is at $V_D$, and off when the gate is more positive than $V_D$ increasing the voltage level of the process. Conducting path includes P+ doped source and drain regions, and a P− doped channel sandwiched between two N+ doped gate regions. For terminals at voltages $V_S$ and $V_D$, operating range of NJFET gate is less than $V_S$ to $V_S$, while the operating range for PJFET gate is $V_D$ to more than $V_D$. Non-overlapping gate voltages prevent having a common gate input.

Compared to the non-conducting body 400 of MOSFET on FIG. 4, the JFET has a conducting channel 406 between source and drain. Due to non-overlapping gate voltages and the high voltage range thus needed, a complementary JFET process is impractical to realize. Hence there is no low cost process that provides CJFET devices analogous to CMOS devices. Compared to the MOSFET in FIG. 4, a JFET conducting channel is formed inside the body of the switching device. This channel current is not affected by trapped oxide charges near the gate, a draw back with MOSFETs. Compared to MOSFETs, JFETs also have poorer switching characteristics due to higher depleted charge stored in the channel and the transient times required to accumulate and disperse this depletion charge. Reverse biased junctions hurt JFET device ease of use and popularity in modern day ICs.

FIG. 6A illustrates the conventional CMOS inverter shown in FIG. 2A constructed with MOSFET transistors. There is no equivalent JFET construction due to gate voltage limitations. In the conventional CMOS inverter shown in FIG. 6A, the conducting path 610 allows current flow between terminal 603 and output 602, while conducting path 620 allows current flow between terminal 604 and output 602. The conducting paths 610 and 620 are constructed in single crystal semiconductor active geometries and have strong current drive. These active geometries are physically separated to allow for the latch up related well rules discussed earlier. First device comprises gate 612 and conducting path 610. Second device comprises common gate 612 and conducting path 620. Conducting path 610 couples output 602 to first voltage source 603. Conducting path 620 couples output 602 to second voltage source 604. Voltage level at common gated input 601 selects which of the two voltage sources 603 or 604 is coupled to output 602. While construction in FIG. 6A allows for high speed memory applications, the Silicon foot-print is large and expensive.

FIG. 6B illustrates the conventional R-load inverter shown in FIG. 3A constructed with a NMOS transistor. In this conventional resistor load inverter the conducting path for current flow is via the resistor and the single crystal active region. The conducting path 630 is the resistor or the TFT resistor itself. This resistance is very high and the drive current is very weak. Second device comprises gate 632 and conducting path 640. Conducting paths 630 and 640 are physically separated to facilitate the vertical integration. Conducting path 630 permanently couples a first voltage source 623 to output 622 very weakly. Strong conducting path 630 is able to couple output 622 to second voltage source 624 when activated. Voltage level at input 621 couples the output 622 to one of two voltage sources 623 or 624. While construction in FIG. 6B allows a smaller Silicon foot-print, the weak pull-up resistor makes this memory cell not suitable for high speed applications. In both cases the two conducting paths are constructed in two separate semiconductor geometries and connected together at the common node by either metal contacts, or buried contacts.

FIG. 7 illustrates a conventional 6T-SRAM cell shown in FIG. 1A. Two inverters 750 and 760 in the conventional embodiment as shown in FIG. 6A share common power supplies 708 and 707. These may be power and ground voltages respectively. Very often the power supplies are shared at a common node by two adjacent PMOS or NMOS transistors, as shown by node 708 in FIG. 7. First inverter 750 has a common gate 712 and two conducting paths 710 and 720 connected to power supplies 707 and 708. The common output is 715. Similarly a second inverter 760 has a common gate 732 and two conducting paths 730 and 740 connected to power supplies 707 and 708. The common output is 716. Conducting paths are physically separated due to latch up considerations as discussed earlier. Both inverters 750 and 760 have conducting paths in a single crystal high mobility semiconductor layer. In standard CMOS, these are Silicon active geometries for PMOS and NMOS. These active geometries have multiple doped regions in the conducting path and have isolation oxide separating the geometries For PMOS the Silicon conducting path includes P+ source, P surface inversion layer in Nwell and P+ drain. For NMOS the Silicon conducting path includes N+ source, N surface inversion layer in Pwell and N+ drain. Access device 770 couple data path 701 to inverter 750 output, while access device 780 couple data path 704 to inverter 760 output. These data paths have a plurality of access devices connections in a memory array. Gate 706 activates device 780, while gate 703 activates device 770 by turning those devices on or off. Typically these devices 770 and 780 are strong NMOS transistors. Gates 706 and 703 are coupled to row lines 705 and 702 respectively that may have a plurality of access device connections. Data paths 701 and 704 and row lines 705 and 702 are arranged in orthogonal column and row orientation to allow unique access to each cell in a cell array. Conducting paths 755 and 765 of the access devices are also constructed in the same semiconductor layer as in inverters 750 and 760. In CMOS, conducting paths 710, 730, 755, 765 are NMOS active areas and share a common geometry. Conducting paths 720 and 740 are PMOS active areas sharing another common geometry separated from NMOS by an isolation oxide region. In this configuration the two inverters are constructed as two geometries in a single layer.

SUMMARY

In one aspect, a latch comprises two back to back inverters formed on two separate semiconductor layers. A high performance inverter is constructed on a high mobility semiconductor layer. A lower performance inverter is constructed in a lower mobility semiconductor layer. The two inverters are stacked one above the other to reduce the latch area, and connected back-to-back to provide the necessary feed-back. This arrangement allows fast access times at a reduced foot-print for high density memory. A semiconductor latch for integrated circuits is adapted to have a first supply voltage and a second supply voltage substantially at a lower voltage level than said first supply voltage. The latch comprises a first and a second semiconductor layer, substantially different from each other; a first inverter having, a first conducting path coupled to said first supply voltage and an output, and a second conducting path coupled to said second supply voltage and said output, and said first and second conducting paths constructed in said first semiconductor layer; and a second inverter having a first conducting path coupled to said first supply voltage and an output, and a second conducting path coupled to said second supply voltage and said output, and said first and second conducting paths constructed in said second semiconductor layer.

In a second aspect, a latch comprises two lower performance back to back inverters formed on a second semiconductor thin film layer, substantially different from a first semiconductor substrate layer used for logic transistor construction. This latch is stacked above the logic circuitry for slow memory applications with no penalty on Silicon area and cost. A semiconductor latch for integrated circuits is adapted to have a first supply voltage and a second supply voltage substantially at a lower voltage level than said first supply voltage. The latch comprises a semiconductor thin film layer, substantially different from a semiconductor substrate layer; a first inverter having a first conducting path coupled to said first supply voltage and an output, and a second conducting path coupled to said second supply voltage and said output, and said first and second conducting paths constructed in said semiconductor thin film layer; and a second inverter having a first conducting path coupled to said first supply voltage and an output, and a second conducting path coupled to said second supply voltage and said output, and said first and second conducting paths constructed in said semiconductor thin film layer.

Advantages of the invention may include one or more of the following. A smaller area latch is constructed in one semiconductor geometry by eliminating the latch-up spacing requirement. The latch is constructed in a second semiconductor plane, different from a first plane used for logic transistor construction. The latch is embedded above logic transistors taking no effective Silicon area. The latch contains all MOSFET transistors. The latch contains all Gated-FET transistors as discussed in "Insulated-Gate Field-Effect Thin Film Transistors". The latch contains mixed MOSFET and Gated-FET transistors. The transistors are fully depleted thin film devices. The transistors have fully salicided source and drain regions adjacent to lightly doped tip regions to reduce source and drain resistance. A smaller area SRAM cell is constructed with a latch having a smaller area. A split level SRAM cell is constructed with a split level latch: one inverter in a first plane, and a second inverter in a second plane. An SRAM cell has a first inverter in the substrate layer, and a second inverter in a thin film layer substantially above said first inverter. The first semiconductor layer is single crystal Silicon. The substrate layer has high performance strong transistors. The SRAM cell has one or more access transistors to access memory data. Access device for high performance inverter is also high performance. The high performance inverter is fabricated as SOI inverter, or thinned down SOI inverter. The second thin film layer is polycrystalline Silicon. The poly-Silicon inverter is low performance, and only acts to hold the data state in the high performance inverter. The access device for low performance inverter is also low performance. A latch is constructed with all thin film semiconductor transistors. The thin film is poly-crystalline Silicon containing weak thin film transistors (TFT). TFT layer is stacked above a logic layer and takes no extra Silicon real estate. TFT memory blocks are vertically integrated to a logic process for Field Programmable Gate Array (FPGA) or Field Programmable Video Graphics (FPVG) applications. The split SRAM memory cells are used for high density stand alone and embedded memory applications. The split SRAM memory cells are used for high memory content Look-Up-Table applications.

Advantages of the invention may further include one or more of the following. The latch and SRAM memory cells consume less Silicon. Large memory blocks have a lower cost in spite of the added wafer cost for process complexity. The split level memory cells have very high performance similar to full CMOS SRAM memory. The split level memory cells have very low power consumption similar to full CMOS SRAM memory. High performance new SRAM cells have lower complexity single ended sensing circuitry. New cells are more stable and have better noise immunity. New SRAM cells can be used for very fast access embedded memory applications. Thinned down SOI memory has very high performance. Thin down split SRAM SOI memory allows very high memory densities. Memory cells contain complementary transistors with no stand-by power consumption. The complete memory cell in TFT layers can be stacked above logic transistors. This leads to buried memory configuration. Buried memory has reduced Silicon area and lower cost. Full TFT SRAM memory cells have slower access times, and useful for slow configuration memory applications. Both programmable products can be subsequently mapped to ASICs (Application Specific Integrated Circuit). The SRAM memory is used for prototyping and low volume production, while hard wired ASICs are used for high volume production. The invention thus provides an attractive solution for two separate industries: (i) very high density stand alone or embedded memory for low power, fast access applications and (ii) high-density, buried memory for low cost, slow access programmable applications.

BRIEF DESCRIPTION OF THE DRAWINGS

FIGS. 14.1–14.7 shows layer by layer construction of an exemplary process.

FIGS. 16.1–16.7 shows a layer by layer construction of 6T-SRAM cell shown in FIG. 15.

FIGS. 19A & 191B shows a schematic and cell layout of an exemplary TFT 6T SRAM cell.

DESCRIPTION

The terms wafer and substrate used in the following description include any structure having an exposed surface with which to form the latch structure of the invention. The term substrate is understood to include semiconductor wafers. The term substrate is also used to refer to semiconductor structures during processing, and may include other layers that have been fabricated thereupon. The term layer is used for processing steps used in the manufacturing process. The term layer also includes each of the masking layers of the process. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The term conducting path defines conductors and semiconductors connected in series. A conducting path includes multiple semiconductor regions having different dopant levels. A conducting path may be conductive or non-conductive based on the semiconductor properties in the conducting path. The conductivity of a semiconductor is dependant on the mobility of electrons and holes in said conducting path. The term strong device is used to identify a device with electron and hole mobility similar to single crystal level of semiconductor quality. A weak device include a device having electron and hole mobility below that achieved in single crystal quality semiconductor with equivalent doping. The term geometry is used to define an isolated pattern of a masking layer. Thus one mask layer is a collection of geometries in that mask pattern. The term module includes a structure that is fabricated using a series of predetermined process steps. The boundary of the structure is defined by a first step, one or more intermediate steps, and a final step. The resulting structure is formed on a substrate. The following detailed description is, therefore, not to be taken in a limiting sense.

For the discussion that follows, the terminology Gated-FET device is used. A gated-FET device is defined as a mixed device between a conventional MOSFET device and a conventional JFET device. The Gated-FET device conducting channel is like that of JFET devices: entirely comprising of a thin film resistive channel between the source and drain regions. There is no inversion layer like in a MOSFET to conduct current. The Gated-FET device gate is like that of a MOSFET device: the gate constructed above a dielectric material and capable of modulating the thin film channel conduction. There is no gate junction like in a JFET to reverse bias the channel. The Gated-FET device is disclosed in detail in the application "Insulated-Gate Field-Effect Thin Film Transistors" filed concurrently.

Figure 6A:
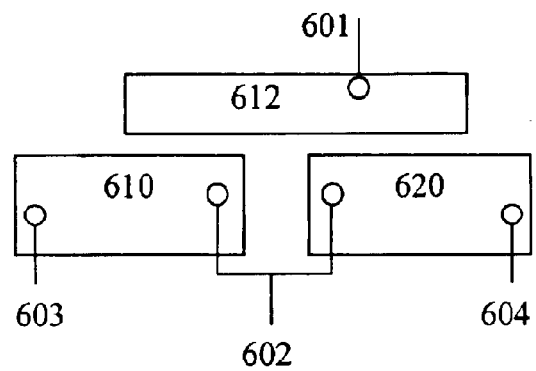
FIGS. 6A, 6B & 6C show three embodiments of switching devices.
Figure 6B:
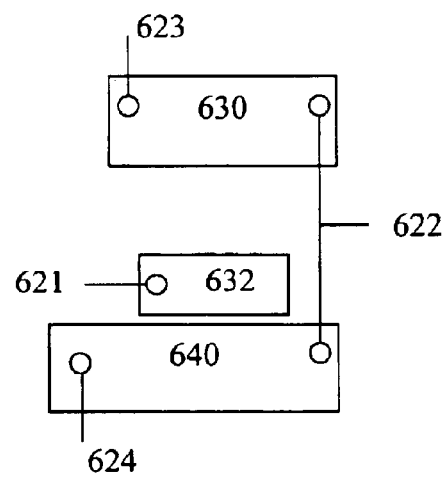

A Gated-FET switching device per embodiment in FIG. 6A comprising: a first device having a conducting path 610 coupled between a first supply voltage 603 and a common output 602; a second device having a conducting path 620 coupled between a second supply voltage 604 and said common output 602; and a common input 601 to control said first and second devices; wherein said conducting path of said first and second devices each comprised of a source, a resistive channel and a drain region, said resistive channel formed in between said source and drain regions having the same dopant type as said source and drain regions, and said resistive channel being modulated to a substantially non-conductive state by a first voltage level of said common input 601 and modulated to a substantially conductive state by a second voltage level of said common input 601.

Figure 6C:
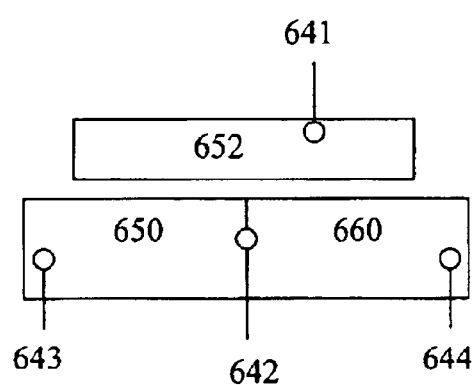

A Gated-FET or MOSFET switching device per embodiment in FIG. 6C comprising: a first device having a conducting path 650 coupled between a first supply voltage 643 and a common output 642; a second device having a conducting path 660 coupled between a second supply voltage 644 and said common output 642; and a common input 641 to control said first and second devices, wherein said conductive paths of first and said second devices comprised of a single geometry of a semiconductor material. The device in FIG. 6C is further comprised of said conducting path modulated to a non-conductive state by a first voltage level of said common input 641; and said conducting path modulated to a conductive state by a second voltage level of said common input 641. The inverter in FIG. 6C further comprises a common gate 652 to control both devices. These devices may be constructed as thin film MOSFET or thin film Gated-FET devices according to the teachings disclosed in prior applications.

In a first embodiment of a latch in accordance with the teachings, a semiconductor latch for integrated circuits is adapted to have a first supply voltage and a second supply voltage substantially at a lower voltage level than said first supply voltage. The latch comprises a first and a second semiconductor layer, substantially different from each other; a first inverter having a first conducting path coupled to said first supply voltage and an output, and a second conducting path coupled to said second supply voltage and said output, and said first and second conducting paths constructed in said first semiconductor layer; and a second inverter having a first conducting path coupled to said first supply voltage and an output, and a second conducting path coupled to said second supply voltage and said output, and said first and second conducting paths constructed in said second semiconductor layer.

In a second embodiment of a latch in accordance with the teachings, a semiconductor latch for integrated circuits is adapted to have a first supply voltage and a second supply voltage substantially at a lower voltage level than said first supply voltage. The latch comprises a semiconductor thin film layer, substantially different from a semiconductor substrate layer; a first inverter having a first conducting path coupled to said first supply voltage and an output, and a second conducting path coupled to said second supply voltage and said output, and said first and second conducting paths constructed in said semiconductor thin film layer; and a second inverter having a first conducting path coupled to said first supply voltage and an output, and a second conducting path coupled to said second supply voltage and said output, and said first and second conducting paths constructed in said semiconductor thin film layer.

In one embodiment of the new switch, all of the transistors are constructed using MOSFET transistors. In a second embodiment all the transistors are constructed as thin film Gated-FET transistors. In a third embodiment MOSFET and Gated-FET devices are mixed to form complementary transistor pairs. In a fourth embodiment, thin film MOSFET transistors are used. The transistor may be constructed on Silicon substrate. The transistor may be constructed on SOI substrate, or thinned down SOI substrate. The use of transistor types will be discussed later.

Figure 8:
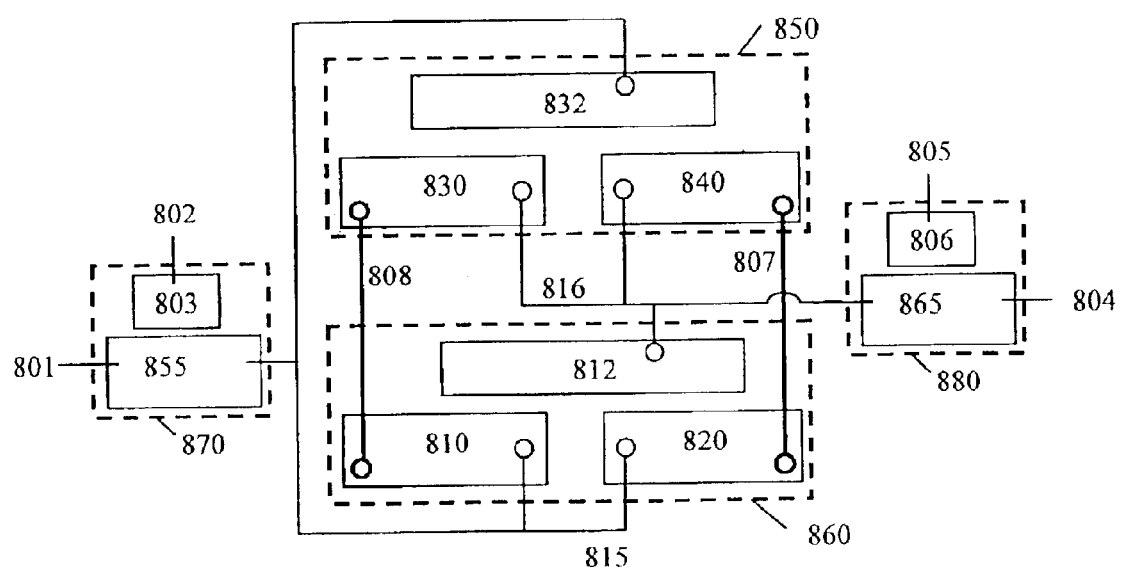
FIG. 8 shows a first embodiment of a new memory cell.

FIG. 8 demonstrates one embodiment of a new latch and an SRAM cell for integrated circuits. It is comprised of a first supply voltage 808, and a second supply voltage 807 at a substantially lower voltage level to first voltage level. Typically supply 808 is system power at $V_D$ and supply 807 is system ground at $V_S$. The latch has a first and a second semiconductor layer, substantially different from each other to construct the two inverters. The first semiconductor layer may also be used to construct logic transistors for the integrated circuit. A first inverter 860 has a first conducting path 810 coupled to first supply voltage 808 and an output 815, and a second conducting path 820 coupled to second supply voltage 807 and output 815. For the first inverter, first and second conducting paths are constructed in the first semiconductor layer. A second inverter 850 has a first conducting path 830 coupled to first supply voltage 808 and an output 816, and a second conducting path 840 coupled to second supply voltage 807 and output 816. For the second inverter, first and second conducting paths are constructed in the second semiconductor layer. The first semiconductor layer for the latch may be Silicon substrate having a high mobility and a second semiconductor layer for the latch may be poly-crystalline Silicon having a lower mobility. This allows strong inverter 860 to be high performance, while weak inverter 850 is lower performance. First inverter 860 has an input gate 812 selectively coupling one of supply voltages to output 815, and second inverter 850 has an input gate 832 selectively coupling one of supply voltages to output 816. Input 812 of first inverter is coupled to output 816 of second inverter, and input 832 of second inverter is coupled to output 815 of first inverter to complete feed back.

Figure 3A:
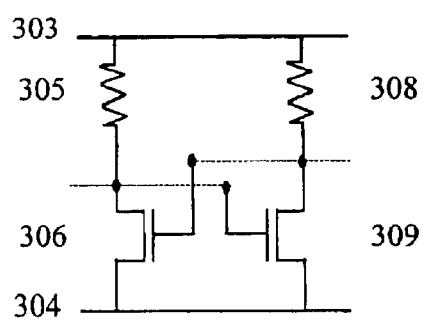
FIGS. 3A & 3B shows a conventional resistor load and a TFT PMOS load latch.
Figure 3B:
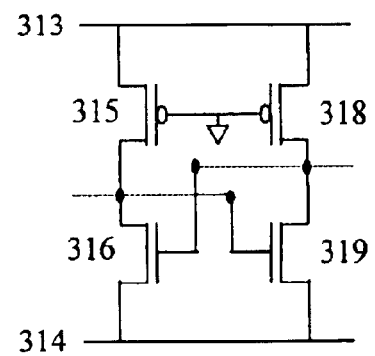
Figure 7:
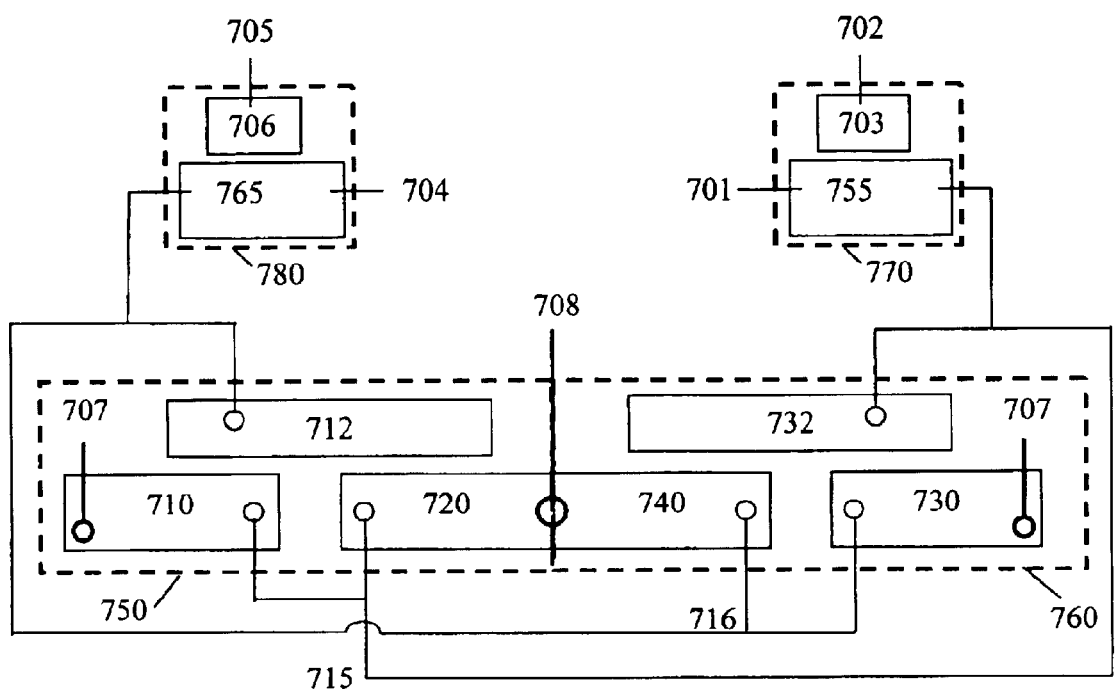
FIG. 7 shows a conventional six transistor CMOS memory cell.

In FIG. 8 the two semiconductor layers are substantially above one another showing a 3D vertical latch construction. The second inverter does not contribute to the Silicon foot print. In another embodiment the two semiconductor layers may be in two separate planes. Latch in FIG. 8 is further comprised of a first access device 870 having a conducting path 855 connecting output 815 of first inverter 860 and a first data line 801, and a gate 803 coupled to a first row line 802. Conducting path 855 of first access device 870 is constructed in first semiconductor layer. This enables both inverter 860 and access device 870 to have the same mobility. On single crystal Silicon substrate they are all high performance devices. First row line 802 at a first voltage level turns conducting path 855 on to substantially couple first data line 801 to output 815 of first inverter, and row line 802 at a second voltage level turns conducting path 855 off to substantially de-couple first data line 801 from output 815 of first inverter. Latch is accessed via the access device 870. To write a zero, data line 801 is forced to zero and row line 802 is forced to one (or voltage $V_D$). An NMOS access device turns on and data line 801 forces inverter 860 output 815 to a low voltage. The inverter 860 is sized to, facilitate this write operation. During read, data line 801 is biased to a mid point voltage level between $V_S$ and $V_D$. Typically this voltage level is tied to a sense amplifier reference voltage level or a trip voltage level. Row line is forced high allowing inverter 860 to charge or discharge the data line. The pull-up and pull-down devices in the inverter 860 either raise or lower the voltage of the data line 801. The sense amplifier detects a small voltage shift, sensing a zero or one at the inverter 860 output. Having the same semiconductor layer for transistors 860 and 870 allow appropriate sizing needed to read and write data. When the first semiconductor layer is single crystal Silicon, the high mobility access device 870 and inverter 860 generate high current drive. Both PMOS and NMOS in strong inverter 860 have high current drive. That will charge and discharge the data line very quickly. It will also allow a single ended sensing scheme to evaluate data as the data line voltage moves in either direction. A weak PMOS as shown in FIG. 3 requires dual ended sensing as the data line can only discharge from the strong NMOS. Having inverter 850 constructed substantially above inverter 860 reduces the SRAM cell area by more than 50%. Smaller cell decreases the lengths of data line and row line for the same density memory block between conventional SRAM in FIG. 7 and new SRAM in FIG. 8. For a 50% smaller area, the data line and row line lengths reduce by 30%. Reduced data line and row line capacitances make the new SRAM memory twice as fast for a comparable inverter strength.

Latch in FIG. 8 has a second access device 880 having a conducting path 865 connecting output 816 of second inverter 850 to a second data line 804, and a gate 806 coupled to a second row line 805 to control the access device. The conducting path 865 of second access device 880 is constructed in the second semiconductor layer, same as conducting paths 830 and 840 of inverter 850. This enables easy scaling of device sizes to write data into inverter 850 via data line 804. The second row line 805 at a first voltage level turns conducting path 865 on to substantially couple second data line 804 to output 816 of second inverter 850. Row line 805 at a second voltage level turns conducting path 865 off to substantially de-couple second data line 804 from output 816 of second inverter 850. When the access device is an NMOS, it is turned on and off by applying $V_D$ and $V_S$ via row line 805 to gate 806. In one embodiment, the second semiconductor layer is polycrystalline Silicon having a lower mobility for electron and hole conduction. In another embodiment the second semiconductor layer is laser re-crystallized amorphous poly-Silicon thin film layer with reasonably high mobility. Advances is re-crystallization techniques will enable the formation of a second semiconductor layer having similar electron and hole mobility to that in single crystal Silicon. For most thin films, the second inverter 850 is a weaker inverter and cannot charge and discharge data line 804 as quickly as strong inverter 860. Hence data line 804 is not utilized to access data in the latch. Access device 850 may be utilized instead to write data to the latch; more desirably to write data level zero via data line 804 to reset the latch. For this condition, data line 804 can be a local ground voltage node, same as voltage level 807 used for the latch. This reset function can be achieved in a variety of modes: sector by sector, row by row or column by column. It depends on how the gate 806 is accessed by the row line 805. Sector erase is achieved by a row line 805 common to the whole sector. Row by row erase is achieved by connecting all latches in one row line 802 also to one row line 806. Column by column erase is achieved by running the row line 806 parallel to data line 801, connecting all the latches in one data line 801 to one row line 806.

In a first preferred embodiment, the first semiconductor layer is Silicon substrate and a second semiconductor layer is poly-crystalline, Silicon layer. Inverter 860 and access device 870 are constructed as regular MOSFET devices. FIG. 8 shows that the conducting paths 810 and 820 are not constructed in a single geometry due to latch up rules between NMOS and PMOS devices. Inverter 850 and access device 880 are constructed as thin film devices. In one case, they are thin film MOSFET devices, and in a second case they are Gated-FET devices, and in a third case they are mixed MOSFET and Gated-FET devices. In a second preferred embodiment, the first semiconductor layer is an SOI substrate, and inverter 860 and access device 870 are comprised of SOI MOSFET devices. In a third embodiment, the first semiconductor layer is a thinned down SOI Silicon region. The inverter 860 and access device 870 are now thin film devices comprised of MOSFET or Gated-FET devices. Thin film devices have advantages when the thin film is fully depleted under one of two operation conditions, and accumulated in the other operating condition. These have been discussed in detail in the co-patent applications submitted herewith.

In yet other embodiments, first and second semiconductor layers may be a first and second poly-crystalline Silicon layer, substantially different from Silicon substrate layer used for logic transistor construction. This facilitates low performance, small area SRAM cells to be vertically integrated above logic transistors for 3D Integrated Circuits. The performance of these SRAM cells improves with improvements in re-crystallization techniques in the semiconductor manufacturing industry.

Figure 2A:
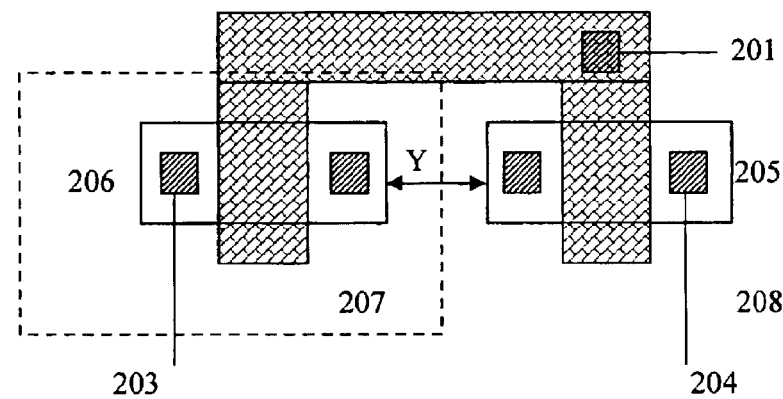
FIGS. 2A & 2B shows top and cross sectional views of a conventional CMOS inverter on a twin well logic process.
Figure 2B:
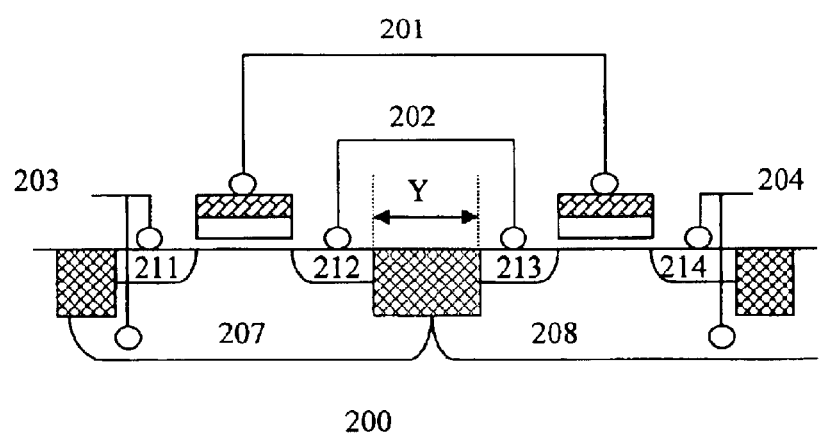
Figure 9:
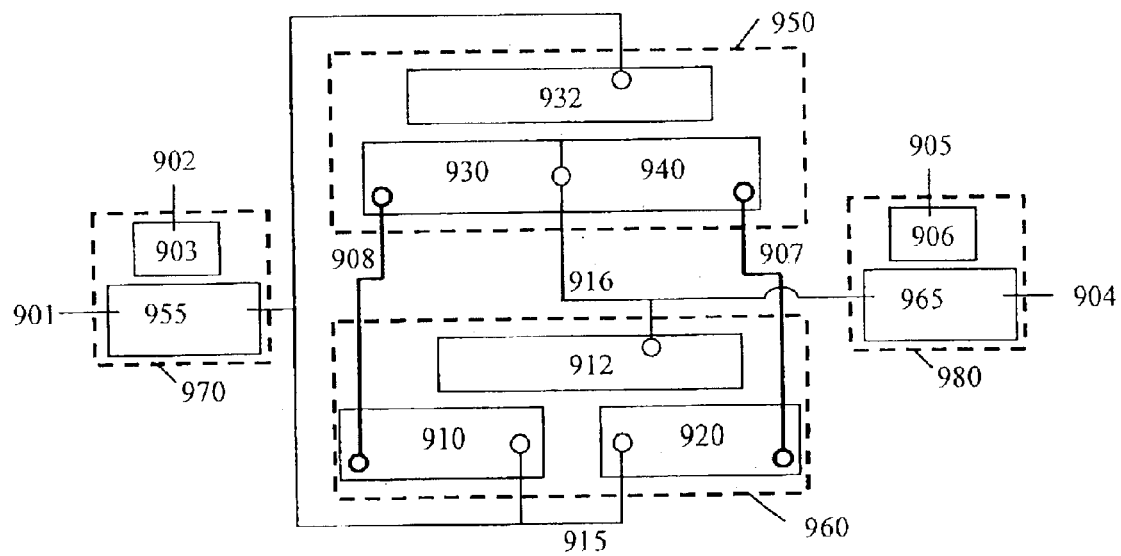
FIG. 9 shows a second embodiment of a new memory cell.

FIG. 9 illustrates another embodiment of a latch and an SRAM cell in accordance with these teachings. All the labels match with the labels in FIG. 8. The latch in FIG. 9 is comprised of a second inverter 950 constructed in a second semiconductor layer compared to first inverter 960 and connected back-to-back. Access devices 970 and 980 provide the necessary connections for data access similar to a conventional 6T SRAM cell. The latch and cell functionality and construction are similar to FIG. 8. In FIG. 9 the inverter 950 is comprised of a single geometry of second semiconductor layer. Conducting path 930 and 940 are formed in a thin film semiconductor layer that is merged together at the common output node 916 to form, that single geometry. This allows eliminating the latch up related distance shown in FIG. 2 for the second inverter, further reducing the cell area needed for the latch. In addition, the conducting path 965 for access device 980 is also in the same thin film semiconductor layer, and can be merged into a single geometry. Inverter 950 and access device 980 are constructed as thin film MOSFET or Gated-FET devices wherein the thin film is fully depleted under one of two operating conditions, and accumulated in the other operating condition.

Figure 10:
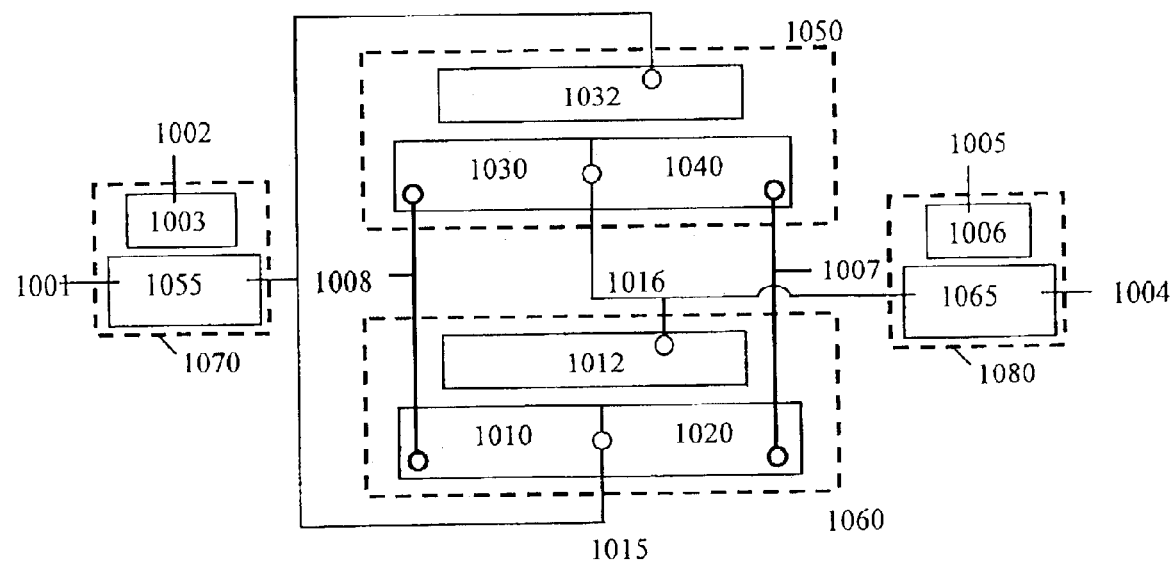
FIG. 10 shows a third embodiment of a new memory cell.

FIG. 10 illustrates another embodiment of a latch and an SRAM cell in accordance with these teachings. All the labels match with the labels in FIG. 8. The latch in FIG. 10 is comprised of a first inverter 1060 constructed in a first semiconductor layer and a second inverter 1050 constructed in a second semiconductor layer, and the two inverters connected back-to-back. Access devices 1070 and 1080 provide the necessary connections for data access similar to a conventional 6T SRAM cell. The latch and cell functionality and construction are similar to FIG. 8. In FIG. 10 both inverters 1060 and 1050 are comprised of a single geometry of a first and second semiconductor layer. Conducting paths 1010 and 1020 are constructed in a single geometry of a first thin film semiconductor layer. Conducting path 1055 of access device 1070 can be merged into the same first semiconductor single geometry. Conducting paths 1030 and 1040 are formed in a second thin film semiconductor layer, and can be merged with the conducting path 1065 of access device 1080 into a single geometry. Conducting paths merge together at the common output nodes 1015 and 1016 respectively to form the two single geometries. This allows eliminating the latch up related distance shown in FIG. 2 for both inverters, further reducing the cell area needed for the latch. Inverters 1050, 1060 and access devices 1070, 1080 are constructed as thin film MOSFET or Gated-FET devices wherein the thin film is fully depleted under one of two operating conditions, and accumulated in the other operating condition. The first semiconductor in this embodiment may be an SOI substrate or a thinned down SOI substrate. The same substrate may be used to build logic transistors. In another embodiment, the first and second layers are thin-film semiconductor layers different from a substrate used for logic transistor construction.

Figure 11:
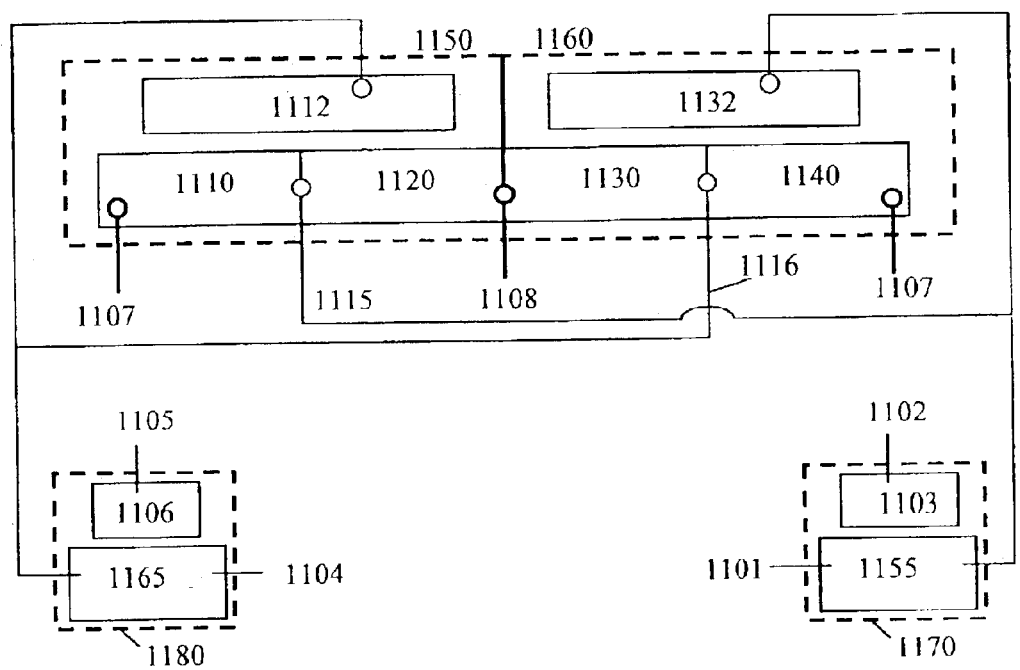
FIG. 11 shows a fourth embodiment of a new memory cell.

FIG. 11 illustrates yet another embodiment of a latch and an SRAM cell in accordance with these teachings. All the labels match with the labels in FIG. 8. The latch comprises a first supply voltage 1108, and a second supply voltage 1107 substantially at a lower voltage level than said first supply voltage. A semiconductor thin film layer, substantially different from a semiconductor substrate layer used for logic transistor construction is used for inverter 1150 and 1160 construction. A first inverter 1150 has a first conducting path 1120 coupled to said first supply voltage 1108 and an output 1115, and a second conducting path 1110 coupled to said second supply voltage 1107 and said output 1115, and said first and second conducting paths constructed in said semiconductor thin film layer. A second inverter 1160 has a first conducting path 1130 coupled to said first supply voltage 1108 and an output 1116, and a second conducting path 1140 coupled to said second supply voltage 1107 and said output 1116, and said first and second conducting paths constructed in said semiconductor thin film layer. The two inverters are connected back-to-back. Access devices 1170 and 1180 provide the necessary connections for data access similar to a conventional 6T SRAM cell. The latch and cell functionality and construction are similar to FIG. 8. In FIG. 11 conducting paths 1110, 1120, 1130 and 1140 for inverters 1160 and 1150 are comprised of a single geometry of a thin film semiconductor layer. Conducting paths merge together at the common output nodes 1115 and 1116 respectively to form that single geometry. This allows eliminating the latch up related distance shown in FIG. 2 for both inverters, further reducing the cell area needed for the latch. In another embodiment, conducting paths 1155 and 1165 of access devices 1170 and 1180 are also integrated into the same thin film semiconductor layer and constructed in a single geometry. Inverters 1150, 1160 and access devices 1170, 1180 are constructed as thin film MOSFET or Gated-FET devices wherein the thin film is fully depleted under one of two operating conditions, and accumulated in the other operating condition.

The embodiment in FIG. 11 illustrates a thin film SRAM cell constructed in a plane substantially different from logic transistor construction plane. The SRAM cell can be substantially above the logic transistor taking no Silicon lateral area. Furthermore, the output 1115 or 1116 can be vertically coupled to logic transistor gates or diffusion nodes with direct contacts. This reduces the use of metal wires needed for local wiring and improves layout efficiency, as in ULSI circuits the first few metal layers are heavily used for local connections. As the SRAM cell is located in the same area as logic transistors, the terminology buried SRAM cell is used in this discussion. TFT film in one embodiment is as deposited poly-Silicon film that is annealed by RTA. In yet another embodiment, this is a laser annealed film to improve the mobility for electron and hole conduction. Advances is re-crystallization techniques will enable the formation of a second semiconductor layer having similar electron and hole mobility to that in single crystal Silicon. In most thin film TFTs the drive currents are lower than single crystal Silicon transistors. TFT memory access times are larger than substrate Silicon memory. TFT memory lends to cost efficiency for slow access applications. Such applications arise in Video Graphics and Programmable Logic industries. In Video Graphics, the video controller of raster displays often includes a video Look-Up-Table, also called a LUT. There are as many LUT entries as pixel values. These values control the intensity or color of the CRT. For 60 times per second refresh rates, the LUT memory access time varies from 50 nSec to 1000 nSec based on how many pixels are fetched in one cycle. Hence 200 nSec to 1000 nSec access times are fairly common to fetch 4 to 16 pixels per display cycle. In Programmable Logic, the customization of the Truth Table logic is stored in Look-Up-Tables also called LUTs. In addition, the programmable MUX data is also stored in latches. Both LUT and MUX memory is called Configuration RAM. These values directly control the signal level on logic gates. There are as many Configuration RAM entries as programmable gates. There is no access time involved. In both cases, an off chip inexpensive permanent memory device such as Flash, DRAM of Magnetic Tape stores the required data, downloading it to buried SRAM memory on chip during power-up for local use. Such techniques can use a local on chip CPU or a memory controller to manage memory refresh, and free system CPU to perform other functions.

Figure 12A:
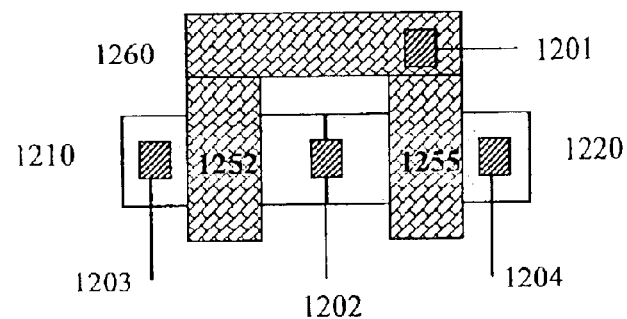
FIGS. 12A & 12B shows top and cross-sectional views of a thin film MOSFET inverter.
Figure 12B:
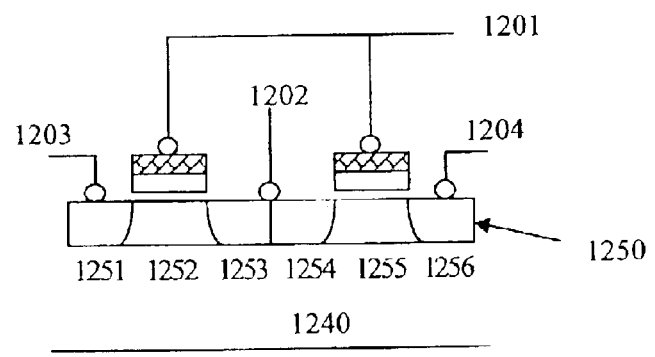

In one embodiment of a new latch, all of the transistors are constructed using thin film MOSFET transistors. FIGS. 12A and 12B show the top view and cross sectional view of a thin film CMOS MOSFET inverter in accordance with aspects of the present invention. Comparing FIG. 2A with 12A, the spacing Y=0 for TFT CMOS inverter. There is also no N-well and no P-well as the body 1250 is very thin. TFT PMOS 1210 is butted against TFT NMOS 1220 at the common output node 1202. Common gate node 1260 having a common input terminal 1201 ties the PMOS gate region 1252 to NMOS gate region 1255. Both devices are built on a single semiconductor geometry 1250 as shown in FIG. 12B, but have multiple implant regions: PMOS source 1251, PMOS body 1252, PMOS drain 1253, NMOS drain 1254, NMOS body 1255, and NMOS source 1256. The NMOS gate above 1255 is doped N+ while the PMOS gate above 1252 is doped P+ to achieve the threshold voltages ($V_T$) for the MOSFETs. For each device, Gate, Drain and Source dopant type is the same. One N+ implant for NMOS and one P+ implant for PMOS can dope Gate, Drain and Source regions after the gates are etched and spacers are formed. The body doping levels P− for NMOS 1255 and N− for PMOS 1252 are chosen to achieve the desirable $V_T$. In FIG. 12B gate 1260 is salicided and drain & source regions are either partially salicided or not salicided. N+ and P+ dopant is needed to define drain and source regions. In another embodiment the source and drain regions are completely salicided as whole layer 1250 is consumed during salicidation to reduce the source & drain resistance. When fully salicided, the source & drain regions are defined by the self aligned tip implants under spacer oxides adjacent to the gate regions and no N+ or P+ implants are needed (such spacers are not shown in FIG. 12, but are similar to those in FIG. 13). The first semiconductor geometry 1250 forming the conducting paths for devices 1210 and 1220 can be a thinned down SOI single crystal Silicon film, or a deposited thin Poly-crystalline Silicon film, or a post laser annealed as deposited amorphous Poly-crystalline Silicon film. The thickness of the first layer and doping are optimized with the gate oxide thickness to get the required $V_T$, on-current and off-current for these devices. The first layer thickness is further optimized to contain the conducting full inversion layer within the film thickness and to ensure a fully depleted body for the MOSFET when the device is on. A thickness parameter X for a semiconductor material is defined by:

$$X = q^2/(2*kT*\epsilon_S) \text{ Angstroms} \quad (EQ\ 1)$$

Where, q is electron charge, kT/q is the thermal voltage and $\epsilon_S$ is the permittivity of the semiconductor material that is used for the conducting body of the MOSFET. For Si semiconductor at 300 Kelvin, X=299 Angstroms. In this embodiment, the first layer thickness $t_{P1}$ in Angstroms and first layer doping D in Atoms/Angstroms³ are chosen such that it satisfies the following inequalities:

$$1/(D*t_{P1}^2) < X \text{ Angstroms} \quad (EQ\ 2)$$

$$1/(D*t_{P1}^2) > 0.5*X\ Ln\ (D/N) \text{ Angstroms} \quad (EQ\ 3)$$

Where, $N_i$ is the intrinsic carrier concentration of the semiconductor material. For Silicon at room temperature, $N_i$=1.45e−14 Atoms/A³. For 250 A thick first Silicon film doped to 5E-7 Atoms/A³, the left hand ratio of Eq-2 and Eq-3 becomes 32 A, while X is 299 A (rounded to 300 A for simplicity) and the right hand side of Eq-3 is 8.6 Angstroms. Both of the inequalities are thus satisfied. For a practical range of gate oxide thicknesses in the range 30 A to 100 A, the body region needs to be doped greater than 1E16 Atoms/cm³ to achieve the correct threshold voltage. For that minimum doping density, the right hand side of Eq-3 becomes 11 Angstroms. The first inequality in Eq-2 ensures that when the MOSFET is on, the inversion layer is fully contained inside the first layer. The second condition in Eq-3 ensures that the first layer is fully depleted when the MOSFET is on. The first thin layer and second gate layer salicidation is achieved in one salicidation process step. The deposited Nickel or Cobalt thickness and Rapid Thermal Anneal cycle optimization will allow full consumption of first layer during salicidation. The functionality of the new inverter is identical to the conventional inverter shown in FIG. 2, but occupies much less area.

Other embodiments may use gate and substrate materials different from Silicon. Gate dielectrics can be oxide, oxy-nitride, nitride, or multi-layered insulators. The semiconductor material may be Silicon, Silicon-germanium, gallium-arsenide, germanium, or any other III-V material. The gate material may be poly-Silicon, aluminum, tungsten, or any other metal. The value of X in equation-1 will change, based on the physical properties of the materials chosen to form the MOSFET device. The device threshold voltage is designed to be in the range ⅕ to ⅓ of Vcc value and the gate oxide thickness is optimized and surface charge density is controlled to achieve that.

Figure 4:
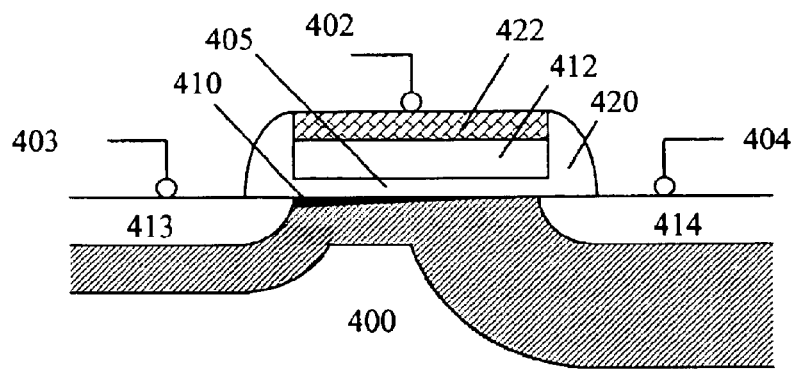
FIG. 4 shows a conventional NMOS transistor conduction channel.
Figure 13A:
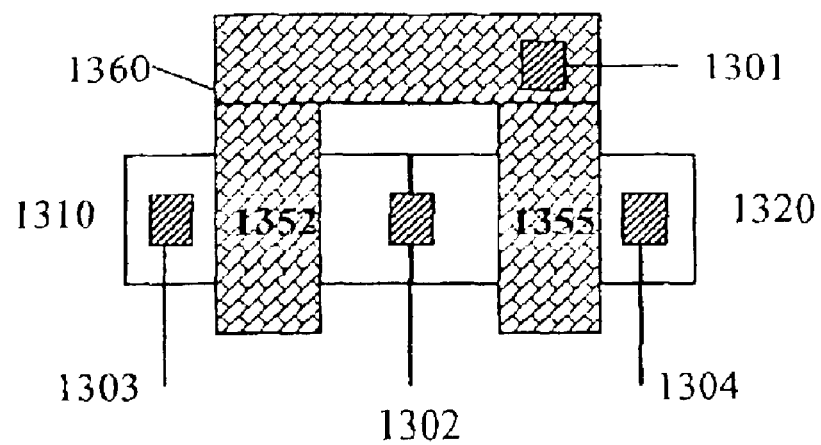
FIGS. 13A & 13B shows top and cross-sectional views of a thin film Gated-FET inverter.
Figure 13B:
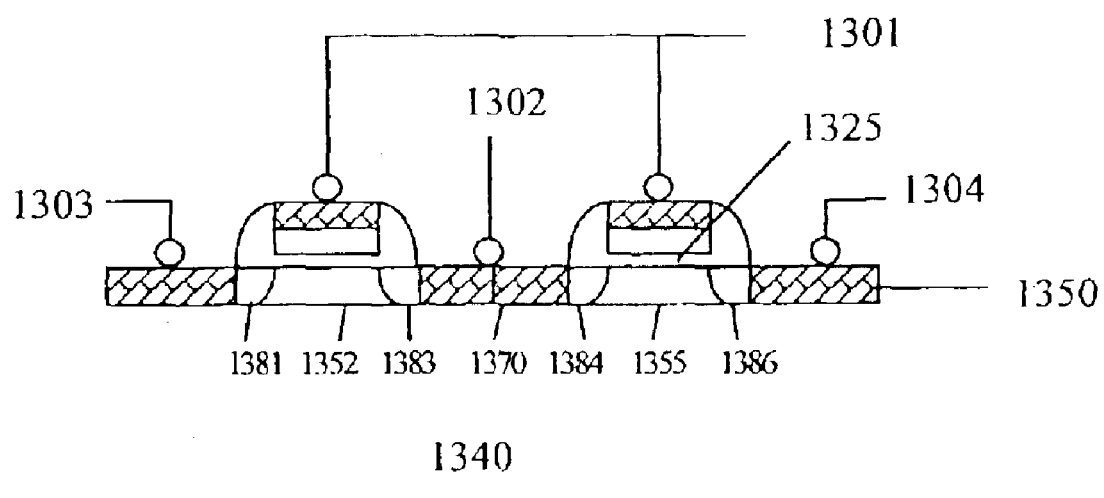

In another embodiment of the inverter, all of the thin film transistors are constructed using complementary Gated-FETs; while maintaining the logic voltage level of the process. FIGS. 13A and 13B show the top view and cross sectional view of a TFT Gated-FET inverter in accordance with aspects of the present invention. Compared to the JFET device in FIG. 5, the Gated-JFET device in FIG. 13 has a similar conducting body, but the double diffused gate is replaced by a single insulated-Gate like that in MOSFET of FIG. 4.

In FIG. 13, a Gated-PFET device 1310 and a Gated-NFET device 1320 are merged at a common node 1302. The Gated-PFET source is connected to a first voltage source 1303 ($V_D$) and Gated-NFET source is connected to a second voltage source 1304 ($V_S$). These could be power and ground terminals respectively. There is also no N-well and no P-well. Common gate node 1360 having a common input 1301 ties the Gated-PFET gate region 1352 to Gated-NFET gate region 1355. During operation, if the gate is zero, the Gated-PFET device 1310 is on, and the Gated-NFET device 1320 is off, and the common node 1302 is coupled to $V_D$ so that the output is at logic one. If the gate is at logic one, the Gated-PFET device 1310 is off and the Gated-NFET device 1320 is on, and the common node 1302 is coupled to $V_S$ to provide a logic zero at the output. Compared to conventional JFET shown in FIG. 5, the thin film Gated-FET can be built with a common gate by appropriate control of layer 1350 thickness. One aspect of this invention is the ability to have a complementary gate input for Gated-FET inverter with identical voltage range $V_S$ to $V_D$.

Both devices are built on a single semiconductor geometry 1350 as shown in FIG. 13B, but have multiple implant regions: Gated-PFET source 1381, Gated-PFET body 1352, Gated-PFET drain 1383, Gated-NFET drain 1384, Gated-NFET body 1355, and Gated-NFET source 1386. In addition there are fully salicided conductors such as region 1370 in the conducting path. The Gated-NFET gate above 1355 is doped P+ while the Gated-PFET gate above 1352 is doped N+ to achieve the threshold voltages ($V_T$) for the Gated-FETs. The channel doping levels N− for Gated-NFET 1355 and P− for Gated-PFET 1352 are chosen to achieve the desirable conducting on and off current levels. In FIG. 13B gate 1360 is partially salicided while source and drain regions are completely salicided like region 1370 to reduce the source & drain resistance. When fully salicided, the source & drain regions are defined by the self aligned lightly doped drain (LDD) tip implants 1381, 1383, 1384 and 1386 shown under the spacer oxides adjacent to the gate regions in FIG. 13C, and no N+ or P+ implants are needed. PJFET LDD tips are P type, while the NJFET LDD tips are N type.

Compared to FIG. 12, the Gated-FET gates in FIG. 13 are doped opposite to Source/Drain LDD dopant type. This is easily achieved in the fully salicided source/drain embodiment shown in FIG. 13B. The Gated-NFET and Gated-PFET gate regions are first doped P+ and N+ respectively before the gates are etched. After gates are etched, prior to spacer formation, Gated-NFETs are implanted with N type LDD tip implant and Gated-PFETs are implanted with P type LDD tip implant. The tip-implant dose is much lower than the gate doping to affect gate doping type. The Source & Drain regions are now defined by the self aligned tip implants shown under the spacer oxides adjacent to the gate regions. As the drain and source regions outside the spacer are fully consumed by salicide, those regions do not need heavy doping. The channel doping levels N− for Gated-NFET and P− for Gated-PFET are chosen to achieve the desirable $V_T$. The Gated-NFET is off with zero bias on the gate by fully depleting the first thin film region under the gate, and is on when the gate is at $V_D$. The Gated-PFET is off with $V_D$ bias on the gate by fully depleting the first thin film region under the gate, and is on when the gate is at $V_S$. The first semiconductor layer forming the body for 1310 and 1320 can be thinned down SOI single crystal Silicon material, or a first thin-film poly-Silicon layer. A thicker first film allows higher current. The thickness is further optimized to allow the entire film to conduct in its on state, and the entire film to be depleted in its off state. A thickness parameter Y for a semiconductor material is defined by:

$$Y = q/(2 * \epsilon_S * \Phi_{MS}) \text{ Angstroms} \quad (EQ\ 4)$$

Where, q is electron charge and $\epsilon_S$ is the permittivity of the semiconductor material that is used for the conducting body of the Gated-FET and $\Phi_{MS}$ is the gate to body work function. When there is fixed charge in the oxide, $\Phi_{ms}$ in EQ-4 is replaced by $V_{FB}$, the flat band voltage for the device. For $\Phi_{MS}$ approximately 1 Volt, and Si semiconductor material, Y is 7.7 Angstroms. In this embodiment, the first layer thickness $t_{P1}$ is in Angstroms, first layer doping D in Atoms/Angstroms³, gate dielectric thickness $t_G$ in Angstroms and permittivity $\epsilon_G$ are chosen such that they satisfy the following inequality:

$$1/[D * (t_{P1} + (\epsilon_S/\epsilon_G) * t_{P1})^2] > Y \text{ Angstroms} \quad (EQ\ 5)$$

For Si-oxide systems with $\Phi_{MS}$ approximately 1 Volt, Eq-5 reduces to:

$$1/[D * (t_{P1} + 3 * t_{OX})^2] > 7.7 \text{ Angstroms} \quad (EQ\ 6)$$

Eq-5 and Eq-6 ensures that the first layer is fully depleted when the Gated-FET is off. For 70 A thick gate oxide, P+ doped poly-Silicon top gate at zero potential, Gated-NFET body N− doped to 5E17 Atoms/cm3, the left hand side of Eq-6 allows a maximum first film thickness of 300 A. A more rigorous surface potential and depletion thickness calculation yields a surface potential of 0.454 volts, and a maximum depletion of 343 Angstroms, in good agreement with this result.

In FIG. 13 the Gated-PFET is built in two thin film layers separated by a gate dielectric 1325 grown either thermally or deposited by PECVD. The first thin film layer 1350 (P1) forms the body of the transistor. In one embodiment, this is thinned down single crystal SOI layer. In another embodiment this is a deposited poly-Silicon layer. The P1 layer is deposited above the insulator layer 1340. A P1 mask is used to define and etch these P1 islands. Gated-PFET regions are mask selected and implanted with P− doping, the channel doping level required for Gated-PFET devices. Gated-NFET gets an N− implant. The gate 1360 is deposited after the gate insulator 1325 is deposited as a second thin film layer (P2). In the embodiment shown, the second thin film layer is a poly-Silicon layer. The Gated-PFET gate poly 1352 is mask selected and implanted N+ prior to gate definition and etch. Gated-NFET gate region 1355 is mask selected and doped P+. The gate regions are then defined and etched. P tip implant region 1381 and 1383 are defined and implanted for Gated-PFET, while an N tips 1384 and 1386 are defined and implanted for Gated-NJFET. This can be done by open selecting Gated-PFET devices, and not selecting Gated-NFET device. The N+/P+ doped gates are not affected by the lower P/N implant levels. Gate 1360 blocks tip implant getting into channel regions 1352 and 1355, and only P1 regions outside P2 gets this P implant. Spacer oxide regions 1381, 1383, 1384 and 1386 are formed on either side of gates by conventional oxide deposition and etch back techniques. In FIG. 13A, the P2 gate 1360 is perpendicular to P1 body 1350. The Gated-PFET P2 gate and spacers sub-divide the P1 body into five regions: (1) source region 1303, (2) source spacer region 1381 doped with P tip implant, (3) channel region 1352 doped with P− implant, (4) drain spacer region 1383 also doped with P tip implant and (5) drain region 1370. The Gated-NFET P2 gate and spacers sub-divide the P1 body into five regions: (1) source region 1304, (2) source spacer region 1386 doped with N tip implant, (3) channel region 1355 doped with N− implant, (4) drain spacer region 1384 also doped with N tip implant and (5) drain region 1370. The source and drain regions are fully salicided and need no implant. After the spacer etch, exposed P2 and P1 regions are reacted with deposited Nickel (or Cobalt) and salicided using Rapid Thermal Annealing. The P tip implant after P2 etch forms self-aligned P Source/Drain tip regions and salicidation after spacer etch forms self aligned Source/Drain salicide regions.

The total resistance of the conducting body region for Gated-PFET and Gated-NFET is determined as follows:

$$R = \rho_{P1} * L_{P2}/(W_{P1} * t_{P1}) \quad (EQ\ 7)$$

Where, $\rho_{P1}$ is the resistivity of lightly doped P1 region in the resistive channel, $L_{P2}$ is poly resistor length 1352 and 1355 in FIG. 13B, $W_{P1}$ is the width of P1 1310 and 1320 in FIG. 13A, and $t_{P1}$ is 1350 P1 thickness (FIG. 13B). Gate voltage and channel depletion heavily modulates resistivity $\rho_{P1}$. Parameters are chosen for R to be in the 1 KOhm to 1 Meg-Ohm range, preferably 10 KOhm to 100 KOhms, when the channel is on. As an example, for P− doping 2E17 atoms/cm³, neglecting the effect of channel modulation in the P− region, the resistivity for single crystal Silicon is 0.12 Ohm-cm. When $L_{P2}$=0.3 μ, $W_{P1}$=0.3 μ, $t_{P1}$=400 Angstroms, R is 30 KOhms. This is the conducting path resistance under flat band conditions. When $V_{DS}$=0.3V, the channel current $I_{ON}$ is 10 µA. Poly-Silicon mobility is lower than single crystal Silicon degrading the on current, while surface accumulation from the gate bias can enhance the on current. Gated-FETs allow thicker P1 film thicknesses compared to MOSFETs in thin film devices, and hence higher currents.

The usage of thin films eliminates the need for diode gates and associated forward biased diode currents in Gated-FETs. Thus, the voltage level is not increased. It also allows forming Gated-NFET and Gated-PFET in the same process, and combining those to form logic inverters with a common thin film node. Moreover, the P1 film isolates N− body and P− body from one another, minimizing latch-up possibilities allowing a smaller inverter layout area. Other embodiments may use gate and substrate materials different from Silicon. Gate dielectrics can be oxide, oxy-nitride, nitride, or multi-layered insulators. The semiconductor material may be Silicon, germanium-Silicon, gallium-arsenide, or germanium. The gate material may be poly-Silicon, aluminum, tungsten, or any other metal. The device threshold voltage is designed to be in the range ⅕ to ⅓ of $V_D$ value.

In other embodiments in accordance with the current invention, the inverter can be made by combining MOSFET and Gated-FET devices. In one embodiment, a PMOS pull up device-1 and Gated-NFET pull down device-2 can form the inverter. In another embodiment, a Gated-PFET pull up device-1 and an NMOS pull down device 2 can form the inverter. The pull-up device source is connected to $V_D$ and pull-down device source is connected to $V_S$ for both inverters. These mixed mode inverter pairs allow first thin-film body to be doped with the same dopant type, facilitating device optimization with less mask counts. Gated-PJFET and NMOS have P− doping in the conducting path. Gated-NJFET and PMOS have N− doping in the conducting path. The LDD tip implant type and gate implant type differentiate between the device types.

For conducting paths 650 and 660 in FIG. 6C a high quality P1 film is beneficial. As used herein, P1 refers to the first thin film semiconductor layer in FIG. 6C forming the conducting paths 650 and 660, and P2 refers to the second semiconductor layer in FIG. 6C forming the gate 652. An ideal film is a single crystal Silicon with a precise thickness control deposited over an insulator. In SOI technology, the single crystal Silicon layer above an insulator meets this criterion. Inside the latch array, P1 is mask selected and thinned down to the required thickness to satisfy the operating needs of the thin film transistors.

The following terms used herein are acronyms associated with certain manufacturing processes. The acronyms and their abbreviations are as follows:

| | |
|---|---|
| $V_T$ | Threshold voltage |
| LDN | Lightly doped NMOS drain |
| LDP | Lightly doped PMOS drain |
| LDD | Lightly doped drain |
| RTA | Rapid thermal annealing |
| Ni | Nickel |
| Ti | Titanium |
| TiN | Titanium-Nitride |
| W | Tungsten |
| S | Source |
| D | Drain |
| G | Gate |
| ILD | Inter layer dielectric |
| C1 | Contact-1 |
| M1 | Metal-1 |

-continued

| | |
|---|---|
| P1 | Poly-1 |
| P2 | Poly-2 |
| P− | Positive light dopant (Boron species, $BF_2$) |
| N− | Negative light dopant (Phosphorous, Arsenic) |
| P+ | Positive high dopant (Boron species, $BF_2$) |
| N+ | Negative high dopant (Phosphorous, Arsenic) |
| Gox | Gate oxide |
| C2 | Contact-2 |
| LPCVD | Low pressure chemical vapor deposition |
| CVD | Chemical vapor deposition |
| ONO | Oxide-nitride-oxide |
| LTO | Low temperature oxide |

A logic process is used to fabricate CMOS devices on a substrate layer. These CMOS devices may be used to build AND gates, OR gates, inverters, adders, multipliers, memory and other logic functions in an integrated circuit. A CMOS TFT module layer or a Complementary Gated-FET TFT module layer may be inserted to a logic process at a first contact mask to build a second set of TFT MOSFET or Gated-FET devices. An exemplary logic process may include one or more of following steps:

P-type substrate starting wafer

Shallow Trench isolation: Trench Etch, Trench Fill and CMP

Sacrificial oxide

PMOS $V_T$ mask & implant

NMOS $V_T$ mask & implant

Pwell implant mask and implant through field

Nwell implant mask and implant through field

Dopant activation and anneal

Sacrificial oxide etch

Gate oxidation/Dual gate oxide option

Gate poly (GP) deposition

GP mask & etch

LDN mask & implant

LDP mask & implant

Spacer oxide deposition & spacer etch

N+ mask and NMOS N+ G, S, D implant

P+ mask and PMOS P+ G, S, D implant

Ni deposition

RTA anneal—Ni salicidation (S/DIG regions & interconnect)

Unreacted Ni etch

ILD oxide deposition & CMP

FIG. 14 shows an exemplary process for fabricating a thin film MOSFET latch in a thin film module layer. A TFT module is inserted to a logic process to build this second set of devices. In one embodiment the process in FIG. 14 forms the latch in a layer substantially above the substrate layer as shown in FIG. 11. In a second embodiment the process in FIG. 14 forms a latch shown in FIG. 8 and FIG. 9. The processing sequence in FIGS. 14.1 through 14.7 describes the physical construction of a MOSFET TFT device shown in FIG. 4 and FIG. 12. The TFT module in FIG. 14 includes adding one or more following steps to the logic process after ILD oxide CMP step.

C1 mask & etch

W-Silicide plug fill & CMP

~300 Å poly P1 (crystalline poly-1) deposition

P1 mask & etch

Blanket Vtn P− implant (NMOS Vt)

Vtp mask & N− implant (PMOS Vt)
TFT Gox (70 A PECVD) deposition
500 A P2 (crystalline poly-2) deposition
P2 mask & etch
Blanket LDN NMOS N− tip implant
LDP mask and PMOS P− tip implant
Spacer LTO deposition
Spacer LTO etch to form spacers & expose P1
Blanket N+ implant (NMOS G/SJD & interconnect)
P+ mask & implant (PMOS G/S/D & interconnect)
Ni deposition
RTA salicidation and poly re-crystallization (GIS/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-Silicon transistors. In the embodiment in FIG. 14, the module insertion is after the substrate device gate poly etch and the ILD film deposition. In other embodiments the insertion point may be after M1 and the ILD deposition, prior to V1 mask, or between two metal definition steps.

After gate poly of regular logic transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module. In another embodiment poly-Silicon plug fill is used to facilitate higher temperature exposure for TFT films.

Then, a first P1 poly layer, amorphous or crystalline, is deposited by LPCVD to a desired thickness as shown in FIG. 14.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P− doping, while the PMOS transistor regions are mask selected and implanted with N− doping. This is shown in FIG. 14.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P− implant followed by masked N− implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30–200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300 A to 2000 A thick, preferably 500 A is deposited as amorphous or crystalline poly-Silicon by LPCVD as shown in FIG. 14.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). As shown in FIG. 10A, the source & drain P1 regions orthogonal to P2 gate regions are now self aligned to P2 gate edges. The S/D P2 regions may contact P1 via buried contacts. NMOS devices are blanket implanted with LDN N− dopant. Then PMOS devices are mask selected and implanted with LDP P− dopant as shown in FIG. 14.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers 1384 shown in FIG. 13B. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 14.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 14.6. This 100 A–500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions in FIG. 13 and FIG. 14.6. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 14.7.

Figure 5:
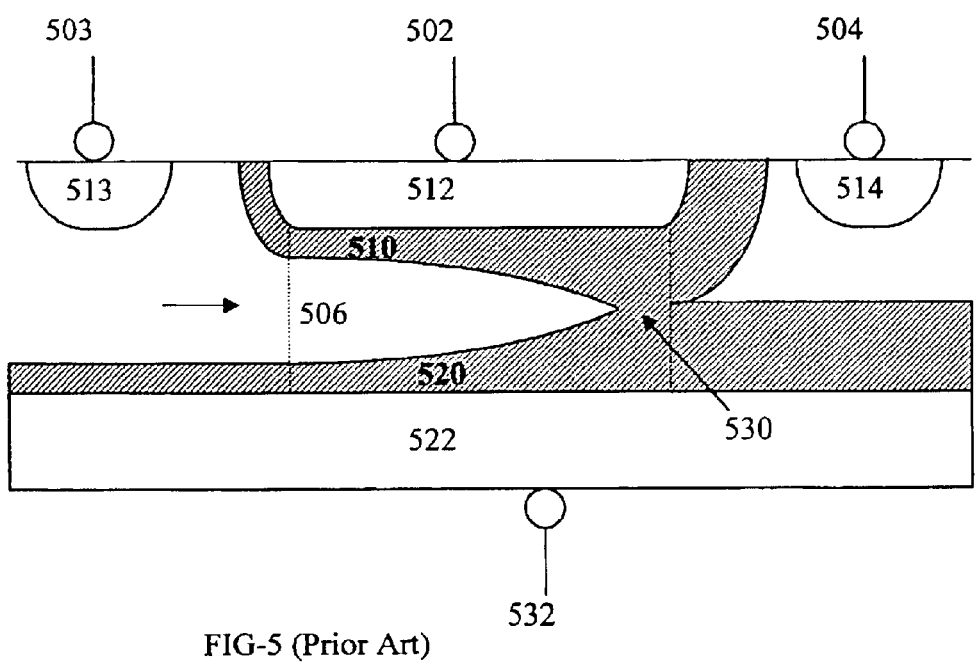
FIG. 5 shows a conventional NJFET transistor conduction channel.

A TFT process sequence similar to that shown in FIG. 14 can be used to build Complementary Gated-FET thin film devices shown in FIG. 5 and FIG. 13. The process steps facilitate the device doping differences between MOSFET and Gated-FET devices, and simultaneous formation of complementary Gated-FET TFT devices. A detailed description for this process was provided when describing FIG. 13 earlier. An exemplary CGated-FET process sequence may use one or more of the following steps:

C1 mask & etch
W-Silicide plug fill & CMP
~300 A poly P1 (crystalline poly-1) deposition
P1 mask & etch
Blanket Vtn N– implant (Gated-NFET $V_T$)
Vtp mask & P– implant (Gated-PFET $V_T$)
TFT Gox (70 A PECVD) deposition
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization In another embodiment, thinned down SOI is used to construct the latch shown in FIG. 11. A logic process used to fabricate CMOS devices on a substrate layer is modified to accommodate thinned down latch regions. These periphery devices may be used to build AND gates, OR gates, inverters, adders, multipliers, memory and other logic functions in an integrated circuit. Latch devices may be constructed to integrate a high density of latches or memory into the first fabrication module. A thinned down module is inserted to an exemplary logic process that may include one or more of following steps:

SOI substrate wafer
Shallow Trench isolation: Trench Etch, Trench Fill and CMP
Sacrificial oxide
Periphery PMOS $V_T$ mask & implant
Periphery NMOS $V_T$ mask & implant
Periphery Pwell implant mask and implant through field
Periphery Nwell implant mask and implant through field
Latch mask and Silicon etch
Latch NMOS $V_T$ mask and implant
Latch PMOS $V_T$ mask and implant
Dopant activation and anneal
Sacrificial oxide etch
Gate oxidation/Dual gate oxide option
Gate poly (GP) deposition
GP mask & etch
LDN mask & N– implant
LDP mask & P– implant
Spacer oxide deposition & spacer etch
N+ mask and N+ implant
P+ mask and P+ implant
Ni deposition
RTA anneal—Ni salicidation (S/D/G regions & interconnect)
Dopant activation
Unreacted Ni etch
ILD oxide deposition & CMP
C mask and etch In this embodiment, the latch body doping is independently optimized for performance, but shares the same LDN, LDP, N+ and P+ implants. The SOI thickness is assumed to be large to warrant well implants for peripheral CMOS devices. Based on dopant type selection, the latch can be complementary MOSFET or Gated-FET devices. In the Gated-FET embodiment, the Gated-FET gates are separately doped N+ & P+ prior to gate etch, and blocked during N+/P+ implants of peripheral devices. In other embodiments, latch devices and periphery devices may share one or more $V_T$ implants. One P2 is used for latch and peripheral device gates. In another embodiment, SOI substrate devices may be integrated with a TFT latch module. This allows for a SOI inverter and TFT inverter to be vertically integrated to build high density, fast access memory devices.

Processes described in the incorporated-by-reference Provisional Application Ser. Nos. 60/393,763 and 60/397,070 support poly-film TFT-SRAM cell and anti-fuse construction. This new usage differs from the process of FIG. 14 in doping levels and film thicknesses optimized for switch applications. The thin-film transistor construction and the Thin-Film Anti-Fuse construction may exist side by side with this Thin-Film Latch element if the design parameters overlap. Such Fuse and Anti-Fuse Non Volatile Memory (NVM) elements allow SRAM memory repair and redundancy implementation for very large memory density arrays.

Figure 1A:
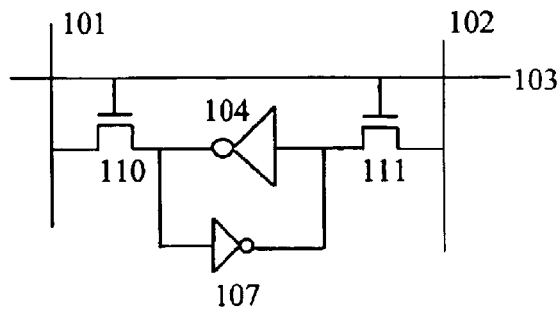
FIGS. 1A & 1B shows a conventional CMOS 6T SRAM cell and a CMOS latch.
Figure 1B:
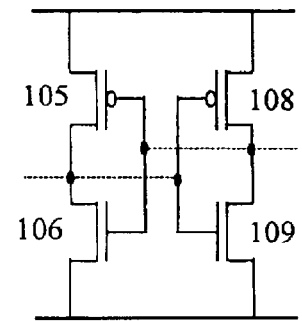
Figure 15A:
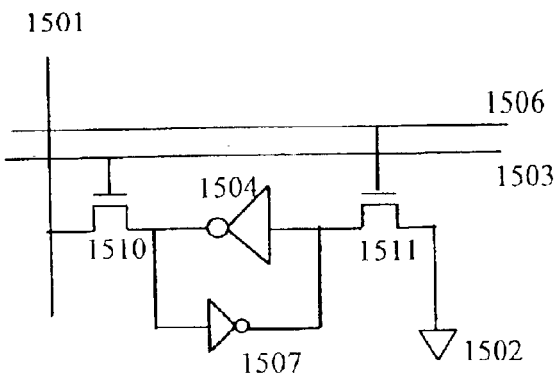
FIG. 15 shows a schematic and an exemplary compact 6T SRAM cell layout.
Figure 15B:
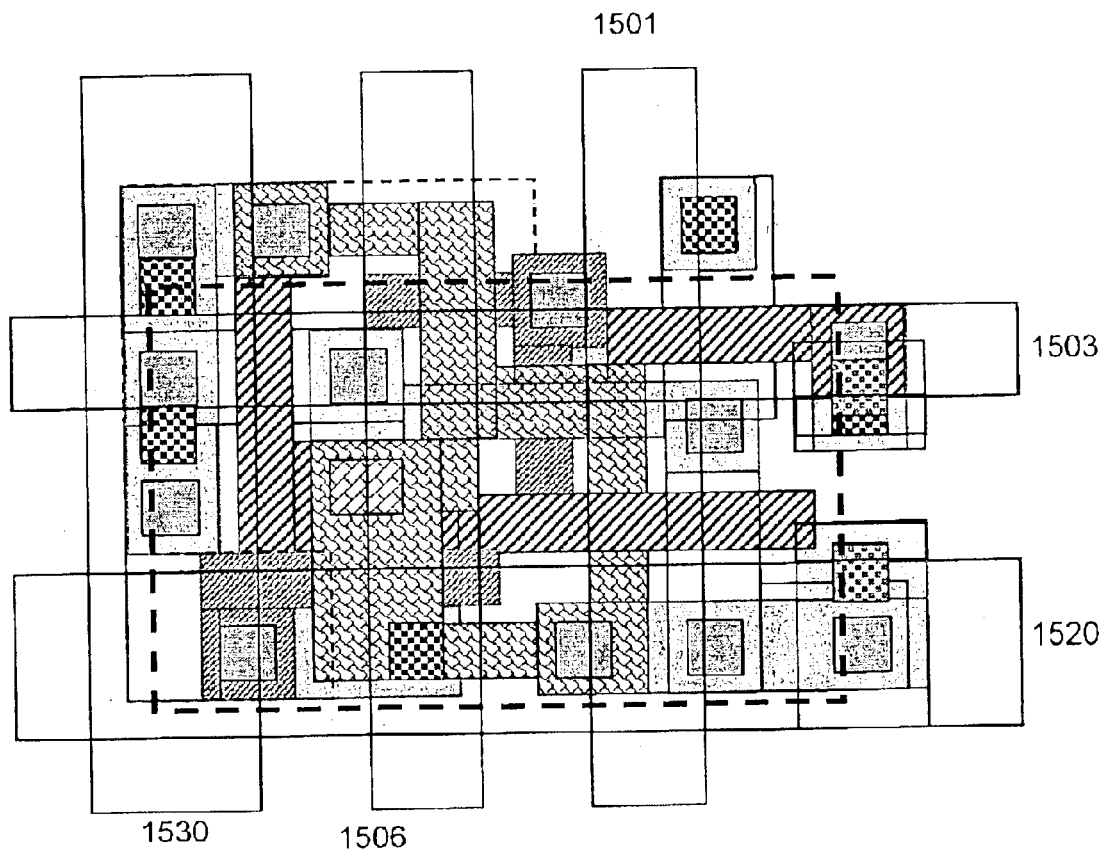

FIG. 15 shows an SRAM cell layout in accordance with the embodiment shown in FIG. 9. Strong MOSFET transistors are fabricated for the first inverter 1504 and access NMOS device 1510. Second inverter 1507 and access device 1511 are fabricated in a thin film semiconductor layer as weak MOSFET or weak Gated-FET TFT devices. Comparing FIG. 15A with FIG. 1A there are some differences in this embodiment of the 6T SRAM memory cell. There are two separate row lines 1506 and 1503. Row line 1503 is used to access data path 1501 to write and read data from the latch. Strong MOSFET devices 1510 and 1507 allow fast access times. Row line 1506 is used as a reset feature. Thin film latch 1507 output is connected to a global ground via the access device 1511. Asserting the row line 1506 pulls the inverter 1507 output to logic zero forcing the input to a logic one. The latch enters a stability point with logic 1 at the output of inverter 1504, and a logic zero at the output of inverter 1507. When the state needs to be reversed, data line 1501 is set to zero and row line 1503 is asserted high. The NMOS pass gate 1510 couples the data line ground to the output of inverter 1504. The stronger data path drives that output to a logic zero, forcing the input to logic 1. Now the data state is reversed from the previous reset state. Each cell can be individually set to a desired state via the data line 1501 and row line 1503. The layout shown in FIG. 15B illustrates the small area realized by constructing one inverter above the other. Compared to regular CMOS layout rules, the layout area is reduced to less than half. Layer by layer construction of FIG. 15B is shown in FIG. 16.1 through 16.7. FIG. 16.1 shows the Nwell and active geometries on substrate Silicon surface. The Nwell (doped N type) is inside geometry 1601, while Pwell (doped P type) is outside that geometry. The active area has four different designations. Inside Nwell, PMOS device has P-diffusion region 1604 and N-tap region 1602. They receive P type and N type implants respectively. Outside the Nwell, NMOS transistors have N-diffusion 1603 and P-tap 1605 regions receiving N type and P type implants respectively. There are two separate active geometries one inside Nwell and one outside Nwell that form conducting paths of the inverters. These are separated by the latch up spacing requirement discussed earlier. Regions outside of the active geometries are trenched etched and filled with an isolation insulator. FIG. 16.2 shows the first poly 1606 used to form the gates of the first inverter and first access NMOS device. The inverter has a common NMOS and PMOS gate, while the access device has an individual NMOS gate. The inverter gate has a contact 1607. This contact is used to connect the feed back of the second inverter to first inverter. This contact is etched in the insulator deposited above the first poly layer 1606. FIG. 16.3 shows the first poly layer P1 1608 deposited and etched above the insulator. The contact 1607 connects the P1 to gate poly of the first inverter. Thin film semiconductor P1 is a single geometry for the cell. FIG. 16.4 shows a second poly P2 1609 layer forming transistor gates to form the second inverter and the second pass gate above the first poly layer. P1 and P2 contacts 1610 are also shown. The common gate inverter has a common node at the center with no latch up related spacing requirement. The P2 pass gate allows access to this common node. FIG. 16.5 shows all of the thirteen contacts 1610 in the cell and metal one 1611 that provides the local interconnect. Buried contact 1607 prevents added metal one in the cell. FIG. 16.6 shows the metal one more clearly to be fully packed inside the cell. Thus the buried contact helps reduce the cell area. In FIG. 16.6, metal one 1611 connects to metal two 1613 through via-1 1612. The V1 surrounded by M1 is connected to M2. Center M1 with no V1 connects the first inverter common node to second inverter gate. FIG. 16.7 shows via-2 1614 connecting M2 to M3 1615.

In FIG. 15B, vertical M2 lines are used for Power $V_D$ line 1530, reset column line 1506 and data line 1501. In this embodiment, the reset feature is column by column. M3 horizontal lines are used for Ground 1520 and row line 1503. The data line and row lines are orthogonal to provide individual access to each cell. On 0.15 micron process design rules, this cell occupies 2.1 square microns, compared to over 4.5 square microns for a typical 6T CMOS SRAM cell. The left four contacts and bottom 4 contacts shown in FIG. 16.5 are shared with adjacent cells. This is possible due to common power and ground levels and global reset feature in this embodiment. The active areas 1604 and 1605 designated as tap regions in FIG. 16.1 shows very strong Nwell tap inside each Nwell, and strong Pwell tap outside Nwell in each cell. This helps with good noise immunity for the SRAM cell.

Figure 17A:
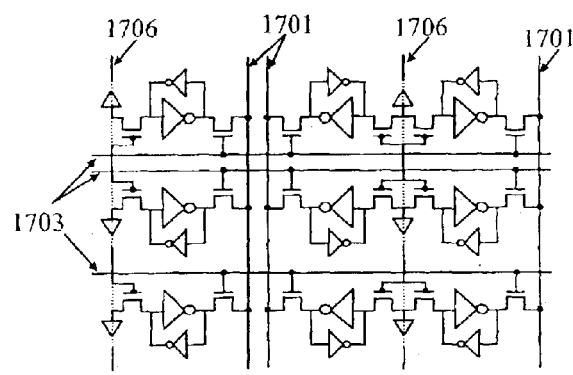
FIGS. 17A & 17B shows an exemplary schematic and layout of 3×3 memory cell array for 6T-SRAM cell in FIG. 15.
Figure 17B:
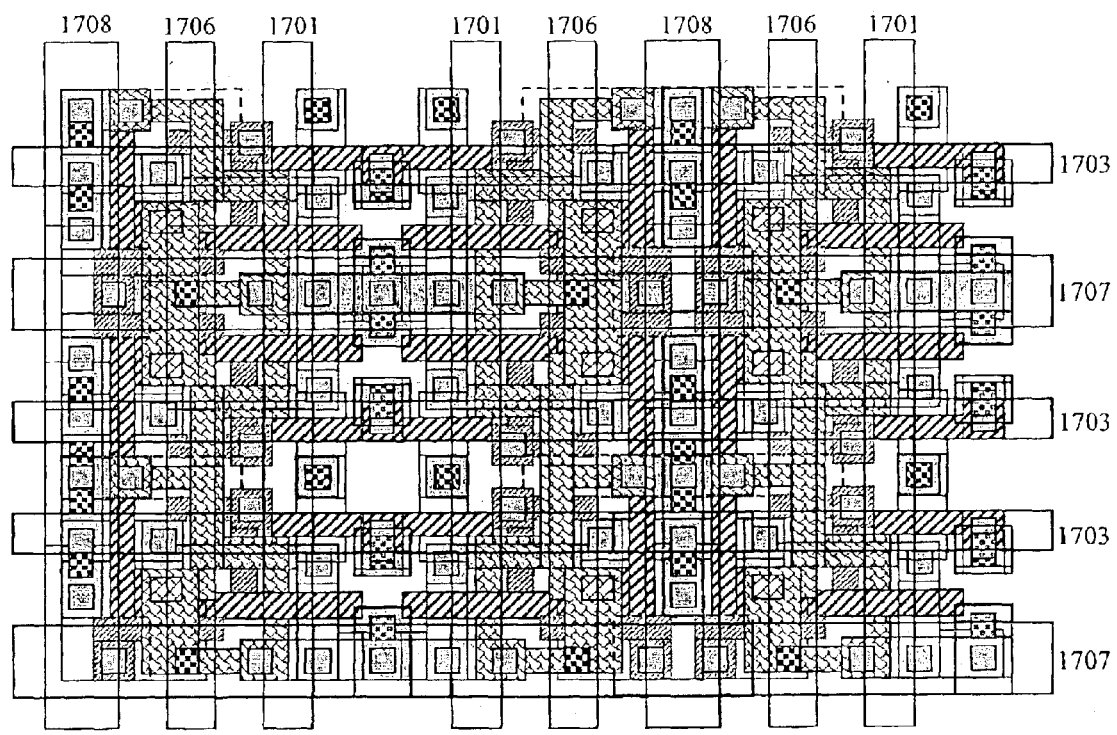

FIG. 17 shows a 3 by 3 SRAM cell array constructed with the single cell shown in FIG. 15B. The schematic is shown in FIG. 17A and the layout is shown in FIG. 17B. The single cell is flipped and mirrored against the sides to form repetitive memory arrays. In FIG. 17A, a plurality of data lines 1701 and a plurality of row lines 1703 provide individual access to the memory cells. A plurality of reset lines 1706 is used to reset the latch via a hard ground connection to the access device (1502 in FIG. 15B). The reset lines 1706, shared by adjacent cells, runs parallel to data lines 1701 providing column by column erase in this embodiment. Power $V_D$ 1708 and ground $V_S$ 1707 wires are not shown in FIG. 17A, but are shown in FIG. 17B. Wires 1708 and 1707 are shared by adjacent cells. This illustration is only to show a typical construction of an SRAM cell utilizing a substrate semiconductor layer for inverter 1504 and access NMOS 1510 in FIG. 15A. Poly-Silicon thin film layer is used for the inverter 1507 and access NMOS device 1511 in FIG. 15A. The latch is constructed according to the embodiment shown in FIG. 9.

Figure 18A:
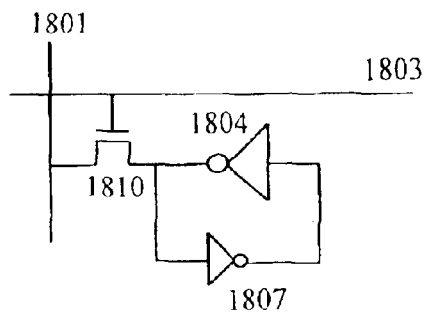
FIGS. 18A, 18B & 18C shows a compact schematic of an individual cell, schematic of a 3×3 array and a single cell layout for an exemplary 5T SRAM cell.
Figure 18B:
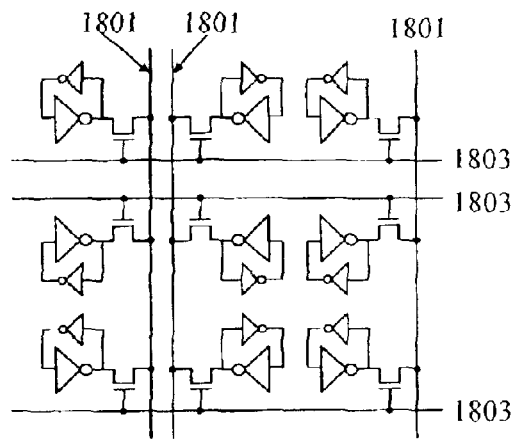
Figure 18C:
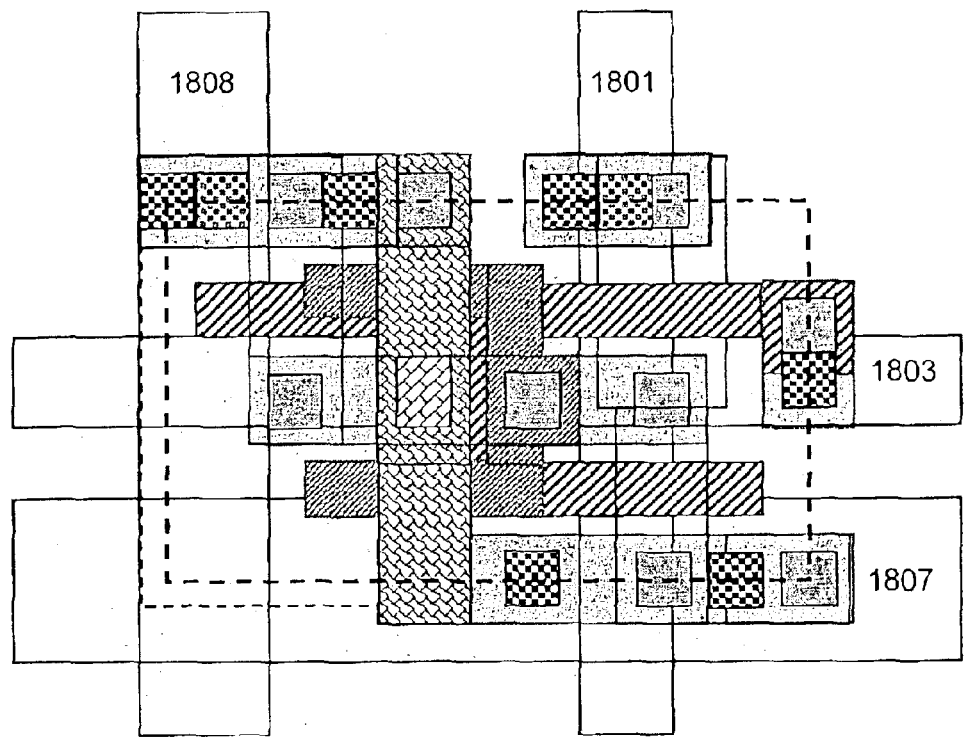

FIG. 18 shows a 5T SRAM, in accordance with this invention as shown in the embodiment in FIG. 9. On 0.15 micron design rules, this cell occupies 1.84 square microns. The single cell schematic is shown in FIG. 18A, a 3×3 array schematic is shown in FIG. 18B and a single cell layout is shown in FIG. 18C. A cell array can be constructed according to the schematic in FIG. 18B with the cell shown in FIG. 18C by the same techniques shown in FIG. 17. The single cell is flipped and mirrored against the sides to form repetitive memory arrays. In FIG. 18B, a plurality of data lines 1801 and a plurality of row lines 1803 provide individual access to the memory cells. There is no reset feature in the 5T configuration. Power $V_D$ 1808 and ground $V_S$ 1807 wires are not shown in FIGS. 18A and 18B, but are shown in FIG. 18C. Wires 1808 and 1807 are shared by adjacent cells in the mirrored cell construction of an array. This illustration is only to show a typical construction of an SRAM cell utilizing a substrate semiconductor layer for inverter 1804 and access NMOS device 1810, and a poly-Silicon thin film inverter 1807 for the latch in FIG. 9.

Figure 19A:
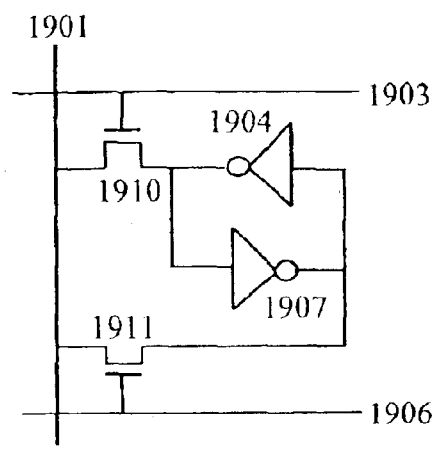
Figure 19B:
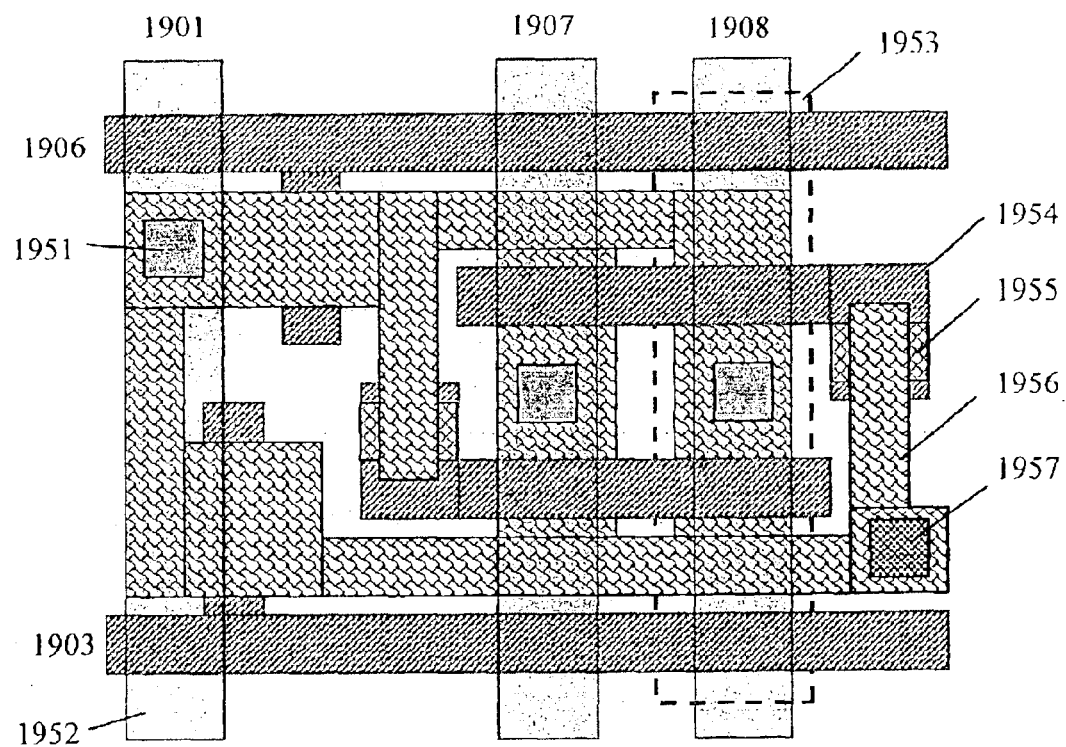

FIG. 19 shows a 6T SRAM in accordance with this invention as shown in the embodiment in FIG. 11. The single cell schematic is shown in FIG. 19A and a single cell layout is shown in FIG. 19B. A cell array can be constructed with the cell shown in FIG. 19B by the same techniques shown in FIG. 17. The single cell is flipped and mirrored against the sides to form a repetitive memory array. In FIG. 19A a single data line 1901 feeds both inverters 1904 and 1907 via access devices 1910 and 1911 respectively. The gates of the access devices are coupled to two row lines 1903 and 1906. The latch is written with a zero on the data line and asserting either row line 1903 or row line 1906. Access device 1910 sets output of inverter 1904 to zero, while access device 1911 sets output of inverter 1907 to zero. Conducting paths for inverters 1904, 1907 and access devices 1910 and 1911 are all constructed in a thin film semiconductor layer, substantially different from the wafer substrate used to construct logic transistors. Power $V_D$ 1908 and ground $V_S$ 1907 wires are not shown in FIG. 19A, but are shown in FIG. 19B. Wires 1908 and 1907 are shared by adjacent cells in the mirrored cell construction of an array. In FIG. 19B, the data line 1901 is orthogonal to both row lines 1903 and 1906 allowing individual access to each memory cell in an array. The conducting paths for devices 1904, 1907, 1910 and 1911 are constructed in a P1 layer 1956. As there are no Nwells in thin film transistors, this layer is constructed in a single geometry. A contact 1957 allows this thin film layer to connect to gate poly or active regions of logic transistors constructed below. The inverter and access devices can be constructed as thin film MOSFET or thin film Gated-FET devices. An implant boundary 1953 determines the device type: inside devices type complementary to outside device type. P1 layer 1956 is separated from P2 layer 1954 by the thin film transistor gate dielectric. Buried contacts 1955 provide regions for P2 to contact P1. This allows compact cross coupling of back to back inverters. Regions where P2 intersects P1 form the transistor. P2 forms the gate and P1 forms the conducting path. A spacer and lightly doped tip regions are not shown in FIG. 19B, but can be constructed according to the process description provided earlier. Both P1 and P2 regions exposed from the top are salicided to form low resistive interconnect. This allows row lines 1903 and 1906 to be constructed as long P2 lines. The TFT transistors are covered by an insulator, and contact 1951 is used to connect P1 and P2 to upper metal-1 1952. This memory cell can be buried above a logic transistor, and the latch output can control the logic gate voltage via contact 1957. The data state of the latch will then determine if the logic gate is on or off, providing programmability to logic gates. In another embodiment, the latch output is fed to sensing amplifiers constructed in single crystal Silicon via contact 1957. These sense amplifiers detect the data inside a memory array built substantially above logic and active circuitry. This allows a low cost memory block to be strapped above active circuitry to reduce Silicon area and cost.

Figure 20A:
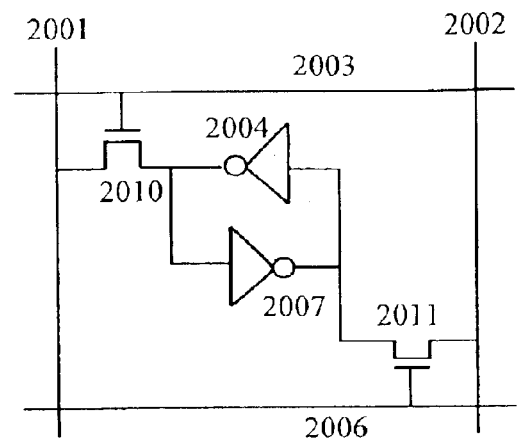
FIGS. 20A & 20B shows a schematic and cell layout of another exemplary TFT 6T SRAM cell.
Figure 20B:
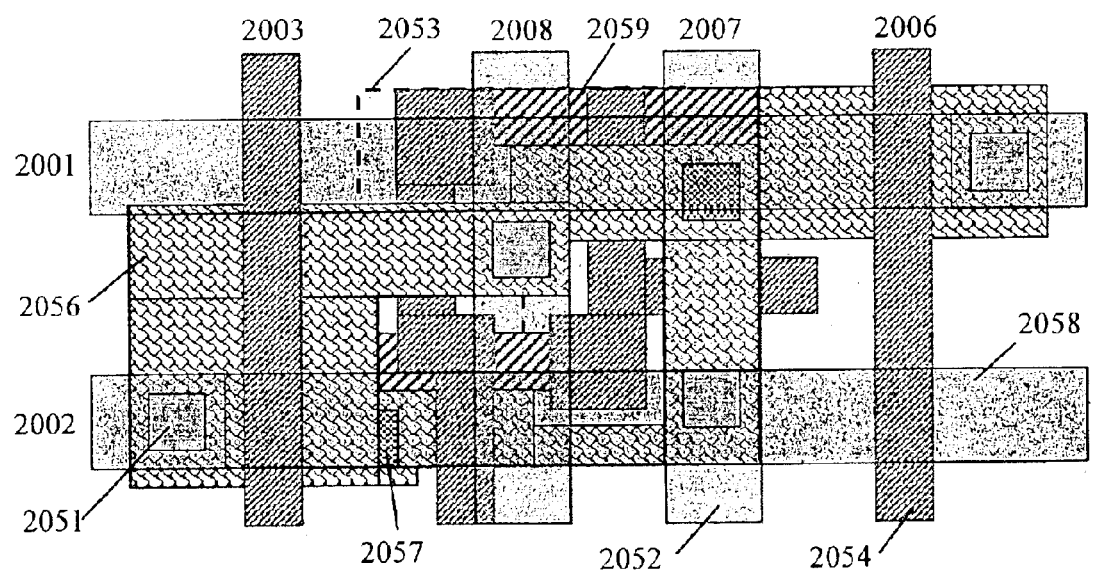

FIG. 20 shows another embodiment of 6T SRAM in accordance with this invention as shown in FIG. 11. The single cell schematic is shown in FIG. 20A and a single cell layout is shown in FIG. 20B. A cell array can be constructed with the cell shown in FIG. 20B by the same techniques shown in FIG. 17. The single cell is flipped and mirrored against the sides to form a repetitive memory array. In FIG. 20A two data line 2001 and 2002 feeds the inverters 2004 and 2007 via access devices 2010 and 2011 respectively. The gates of the access devices are coupled to two row lines 2003 and 2006. The latch is written with a zero on the data line and asserting the corresponding row line. Access device 2010 sets output of inverter 2004 to zero, while access device 2011 sets output of inverter 2007 to zero. Only voltage level zero is applied to data line as NMOS type pass gates conducts zero voltages without a threshold voltage loss. Conducting paths for inverters 2004, 2007 and access devices 2010 and 2011 are all constructed in a thin film semiconductor layer, substantially different from the wafer substrate used to construct logic transistors. Power $V_D$ 2008 and ground $V_S$ 2007 wires are not shown in FIG. 20A, but are shown in FIG. 20B. In FIG. 20B, the data lines 2001 and 2002 are orthogonal to both row lines 2003 and 2006 allowing individual access to each memory cell in an array. The conducting paths for devices 2004, 2007, 2010 and 2011 are constructed in a P1 layer 2056. As there are no Nwells in thin film transistors, this layer is constructed in a single geometry. The inverter and access devices can be constructed as thin film MOSFET or thin film Gated-FET devices. An implant boundary 2053 determines the device type: inside devices type complementary to outside device type. P1 layer 2056 is separated from P2 layer 2054 by the thin film transistor gate dielectric. Gate poly 2059 below is used to make the cross-couple feed back connections via contact 2057. This allows compact cross coupling of back to back inverters. Using gate poly eliminates the buried contact 1955 shown in FIG. 19B making the process cheaper. The same Gate Poly is used by the logic transistors constructed below and easily connected to logic gates. Regions where P2 intersects P1 form the transistor. P2 forms the gate and P1 forms the conducting path. A spacer and lightly doped tip regions are not shown in FIG. 20B, but can be constructed according to the process description provided earlier. Both P1 and P2 regions exposed from the top are salicided to form low resistive interconnect. This allows row lines 2003 and 2006; to be constructed as P2 lines. The TFT transistors are covered by an insulator, and contact 2051 is used to connect P1 and P2 to upper metal-1 2052. Metal-1 is connected to metal-2 2058 using a via-1 stacked on top of contact 2051. The two via-ones are not shown in FIG. 20B and they are located between M1 and M2 above the contacts. This memory cell can be buried above a logic transistor, and the latch output can control the logic gate voltage via Gate Poly 2059. The data state of the latch will then determine if the logic gate is on or off, providing programmability to logic gates. In another embodiment, the latch output is fed to sensing amplifiers constructed in single crystal Silicon via Gate Poly 2059. These sense amplifiers detect the data inside a memory array built substantially above logic and active circuitry. This allows a low cost memory block to be strapped above active circuitry to reduce Silicon area and cost.

Although an illustrative embodiment of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. A semiconductor latch for integrated circuits adapted to have a first supply voltage and a second supply voltage substantially at a lower voltage level than said first supply voltage, the latch comprising:
    a first and a second semiconductor layer, one positioned substantially above the other;
    a first inverter having a first conducting path coupled to said first supply voltage and an output, and a second conducting path coupled to said second supply voltage and said output, and said first and second conducting paths constructed in said first semiconductor layer; and
    a second inverter having a first conducting path coupled to said first supply voltage and an output, and a second conducting path coupled to said second supply voltage and said output, and said first and second conducting paths constructed in said second semiconductor layer.

2. (As Filed) The device in claim 1 further comprising a first access device comprised of:
    a conducting path constructed in said first semiconductor layer coupled to said output of first inverter and a first data line; and
    a gate coupled to a first row line wherein, said gate at a first voltage level turning said conducting path on to substantially couple said first data line to said output of first inverter; and said gate at a second voltage level turning said conducting path off to substantially de-couple said first data line from said output of first inverter.

3. The device as in claim 1 or claim 2, further comprising a single geometry of said first semiconductor layer.

4. The device in claim 1, wherein each of said first and second inverters further comprising an input to selectively couple one of said supply voltages to said output; wherein the inverter output is coupled to said second supply voltage when its input is at first supply voltage level; and the inverter output is coupled to said first supply voltage when its input is at second supply voltage level; and the input of first inverter is coupled to the output of second inverter, and the input of second inverter is coupled to the output of first inverter.

5. The device in claim 1 further comprising a second access device comprised of:

a conducting path constructed in said second semiconductor layer coupled to said output of second inverter and a second data line; and a gate coupled to a second row line wherein, said gate at a first voltage level turning said conducting path on to substantially couple said second data line to said output of second inverter, and said gate at a second voltage level turning said conducting path off to substantially de-couple said second data line from said output of second inverter.

6. The device in claim 1, wherein said second inverter comprises and a thin film inverter.

7. The device in claim 1 further comprising:

a first stability point with the first inverter input at said first supply voltage level; and a second stability point with the first inverter input at said second supply voltage level.

8. The device in claim 5 further comprising a single geometry of said second semiconductor layer.

9. A 3D semiconductor latch for integrated circuits adapted to have a first supply voltage and a second supply voltage substantially at a lower voltage level than said first supply voltage, the latch comprising:

a first and a second semiconductor layer substantially different from each other;

a first inverter having a first conducting path coupled to said first supply voltage and an output, and a second conducting path coupled to said second supply voltage and said output, and said first and second conducting paths constructed in said first semiconductor layer; and a second inverter having a first conducting path coupled to said first supply voltage and an output, and a second conducting path coupled to said second supply voltage and said output, and said first and second conducting paths constructed in said second semiconductor layer; wherein:

said first semiconductor layer is a semiconductor substrate layer used to construct the two conducting paths of said first inverter; and said second semiconductor layer is a poly-crystalline silicon thin film layer used to construct the two conducting paths of said second inverter; and said second inverter is located substantially above said first inverter.

10. As Filed) A Static Random Access Memory Cell comprised of:

a strong inverter having an input and an output;

a strong access transistor coupled between said output of strong inverter and a data line, having a gate coupled to a first row line to selectively access said output of strong inverter;

a weak inverter having an input and an output, and said input of strong inverter coupled to output of weak inverter, and said output of strong inverter coupled to input of weak inverter;

a weak access transistor coupled between said output of weak inverter and a reset line, having a gate coupled to a second row line to selectively access said output of weak inverter;

a semiconductor substrate layer comprising high electron and hole mobility used to construct the conducting paths of strong inverter and strong access device; and a semiconductor thin film layer comprising low electron and hole mobility used to construct the conducting paths of weak inverter and weak access device;

wherein said weak inverter and weak access device are located vertically above the strong inverter and strong access device.

11. A method of making a latch, comprising:

depositing a first semiconductor layer;

fabricating a first inverter having a first conducting path coupled to a first supply voltage and an output, and a second conducting path coupled to a second supply voltage and said output, and said first and second conducting paths constructed in said first semiconductor layer;

depositing an isolation layer;

depositing a second semiconductor layer, substantially different from said first semiconductor layer;

fabricating a second inverter having a first conducting path coupled to said first supply voltage and an output, and a second conducting path coupled to said second supply voltage and said output, and said first and second conducting paths constructed in said second semiconductor layer; and optimizing device and material properties of said first and said second inverter.

12. The method of claim 11, wherein depositing the first semiconductor layer is further comprised of:

forming a substantially single crystal semiconductor layer from one of wafer substrate, SOI substrate and thinned down SOI substrate layers; and forming a semiconductor geometry comprising said conducting path of said first inverter.

13. The method of claim 11, wherein depositing the second semiconductor layer is further comprised of:

depositing the thin film semiconductor layer substantially above a semiconductor substrate layer, and substantially above a gate material used for said a logic transistor gate construction; and forming a semiconductor geometry comprising said conducting path of said second inverter.

14. The method of claim 11 comprises fabricating at least one conducting path of with a thin film MOSFET transistor comprising:

forming a source, a body and a drain region;

forming said body region in between said source and drain regions;

doping said body region with opposite dopant type to said source and drain regions;

depositing an insulator region above said body region;

forming a gate region above said insulator region;

adapting said gate region to receive a voltage to modulate the majority carriers in said body region;

creating a conducting surface inversion state and a non-conducting surface accumulation state in said body region by two voltage levels applied to said gate region; and depleting said majority carriers substantially from said body region during said conducting state.

15. The method of claim 11 comprises fabricating a thin film Gated-FET transistor with a conducting path comprised of:

forming a source, a channel and a drain region;

forming said channel region in between said source and drain regions;

doping said channel region to a resistive level with same dopant type as said source and drain regions;

depositing an insulator region above said channel region;

forming a gate region above said insulator region;

adapting said gate region to receive a voltage to modulate the majority carriers in said channel region;

creating a conducting surface accumulation state and a non-conducting depletion state in said channel region by two voltage levels applied to said gate region; and depleting said majority carriers substantially from said channel region during said non-conducting state.

* * * * *